United States Patent
Park et al.

(10) Patent No.: US 8,976,592 B2
(45) Date of Patent: Mar. 10, 2015

(54) NONVOLATILE MEMORY DEVICE WITH FLAG CELLS AND USER DEVICE INCLUDING THE SAME

(71) Applicant: Samsung Electronics Co., Ltd., Suwon-Si, Gyeonggi-Do (KR)

(72) Inventors: Sang-Soo Park, Hwaseong-Si (GM); Kitae Park, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 21 days.

(21) Appl. No.: 13/804,128

(22) Filed: Mar. 14, 2013

(65) Prior Publication Data

US 2013/0279250 A1 Oct. 24, 2013

(30) Foreign Application Priority Data

Apr. 19, 2012 (KR) ........................ 10-2012-0040903

(51) Int. Cl.
*G11C 11/34* (2006.01)
*G11C 16/28* (2006.01)
*G11C 11/56* (2006.01)
*G11C 16/34* (2006.01)

(52) U.S. Cl.
CPC ............ *G11C 16/28* (2013.01); *G11C 11/5628* (2013.01); *G11C 16/3427* (2013.01); *G11C 11/5642* (2013.01); *G11C 2211/5646* (2013.01)
USPC .................................................. 365/185.17

(58) Field of Classification Search
CPC ....................................................... G11C 16/28
USPC .............................. 365/185.17, 185.2, 185.03
See application file for complete search history.

(56) References Cited

U.S. PATENT DOCUMENTS

| | | | |
|---|---|---|---|
| 7,016,226 B2 | 3/2006 | Shibata et al. | |
| 7,120,052 B2 | 10/2006 | Shibata et al. | |
| 7,292,474 B2 | 11/2007 | Iino et al. | |
| 7,315,471 B2 | 1/2008 | Shibata et al. | |
| 7,443,724 B2 | 10/2008 | Shibata et al. | |
| 7,593,260 B2 | 9/2009 | Shibata et al. | |
| 7,596,022 B2 | 9/2009 | Chae et al. | |
| 7,660,160 B2 | 2/2010 | Kim et al. | |
| 7,782,670 B2 | 8/2010 | Shibata et al. | |
| 7,813,174 B2 | 10/2010 | Shibata et al. | |
| 7,978,514 B2 | 7/2011 | Shibata et al. | |
| 8,019,928 B2 | 9/2011 | Lasser | |
| 8,068,368 B2 | 11/2011 | Kim et al. | |
| 8,107,291 B2 | 1/2012 | Kim et al. | |
| 8,199,583 B2 | 6/2012 | Kim et al. | |
| 2010/0142270 A1* | 6/2010 | Shibata | ............ 365/185.03 |
| 2010/0329015 A1 | 12/2010 | Shin et al. | |

(Continued)

FOREIGN PATENT DOCUMENTS

| | | |
|---|---|---|
| JP | 20040192789 A | 7/2004 |
| KR | 100885783 B1 | 2/2009 |

(Continued)

*Primary Examiner* — Anthan Tran
(74) *Attorney, Agent, or Firm* — Volentine & Whitt, PLLC

(57) ABSTRACT

A nonvolatile memory device includes a flag cell configured to store flag information, a plurality of dummy cells adjacent to the flag cell, and program control logic configured to control a program operation on the flag cell and a dummy program operation on the plurality of dummy cells. When the program operation on the flag cell is performed, the program control logic performs the dummy program operation on at least one of the plurality of dummy cells.

20 Claims, 19 Drawing Sheets

(56) References Cited

U.S. PATENT DOCUMENTS

2010/0332773 A1    12/2010    Park
2011/0242890 A1*    10/2011    Shibata et al. ........... 365/185.03
2013/0188426 A1*    7/2013    Park et al. ................ 365/185.22

FOREIGN PATENT DOCUMENTS

KR    100972715 B1    7/2010
KR    1020110001089 A    1/2011
KR    1020110001094 A    1/2011

* cited by examiner

NONVOLATILE MEMORY DEVICE WITH FLAG CELLS AND USER DEVICE INCLUDING THE SAME

CROSS-REFERENCE TO RELATED APPLICATIONS

A claim for priority under 35 U.S.C. §119 is made to Korean Patent Application No. 10-2012-0040903 filed Apr. 19, 2012, in the Korean Intellectual Property Office, the entire contents of which are hereby incorporated by reference.

BACKGROUND

The inventive concepts described herein relate to semiconductor memory devices, and more particularly, to nonvolatile memory devices having flag cells and to user devices including the same.

Semiconductor memory device are generally classified as volatile or nonvolatile. Volatile semiconductor memory devices lose data stored upon entering a power-off state, while nonvolatile semiconductor memory devices retains data stored therein even during a power-off state. The nonvolatile semiconductor memory device is thus useful to retained store contents in applications where the interruption of supplied power is to be expected.

The flash memory, which is a popular type of nonvolatile memory found in computers, memory cards, and the like, is characterized in part by simultaneous electrical erasure of units (e.g. blocks) of memory cells prior to programming. Further, each memory cell of flash memory may be configured to store 1-bit data or multi-bit data. However, the number of programmed threshold voltage states increases dramatically as the number of bits per memory cell is increased. For example, in the event that 1-bit data is stored, the memory cell is programmed to have a threshold voltage belonging to one of two threshold voltage distributions (or, states). In the event that 2-bit data is stored, the memory cell is programmed to have a threshold voltage belonging to one of four threshold voltage distributions (or, states).

SUMMARY

Example embodiments of the inventive concept provide a nonvolatile memory device, which includes a flag cell configured to store flag information, a plurality of dummy cells adjacent to the flag cell, and program control logic configured to control a program operation on the flag cell and a dummy program operation on the plurality of dummy cells. When the program operation on the flag cell is performed, the program control logic performs the dummy program operation on at least one of the plurality of dummy cells.

In example embodiments, the program control logic omits a verification read operation performed to check whether a threshold voltage of the dummy-programmed dummy cell reaches a target voltage.

In example embodiments, the program control logic performs the program operation on the flag cell and the dummy program operation using an ISPP scheme, and the number of program loops associated with the dummy program operation is smaller than that of the program operation on the flag cell.

In example embodiments, a level of a dummy program voltage at a time when the dummy program operation is started is lower than a level of a program voltage at a time when the program operation on the flag cell is started.

In example embodiments, the nonvolatile memory device further includes a word line connected in common to the dummy programmed dummy cell and the flag cell, a dummy bit line connected with the dummy programmed dummy cell, and a flag bit line connected with the flag cell. The program control logic provides stepwise increasing program voltages to the dummy programmed dummy cell and the flag cell via the word line according to an ISPP scheme including a plurality of program loops, and provides a program-inhibition voltage to the dummy bit line during a program loop where a ground voltage is provided to the flag bit line In example embodiments, the dummy programmed dummy cell and the flag cell are connected via the same word line, and the dummy program operation and the program operation on the flag cell are performed at the same time.

In example embodiments, a threshold voltage of the dummy programmed dummy cell is higher than a threshold voltage of an erase state and lower than a threshold voltage of a programmed flag cell.

Example embodiments of the inventive concept also provide a user device, which includes a nonvolatile memory device, and a controller configured to control the nonvolatile memory device. The nonvolatile memory device includes flag cells configured to store flag information of corresponding pages, respectively, and a plurality of dummy cells adjacent to the plurality of flag cells. When a selected one of the flag cells is programmed, a dummy program operation on at least one, adjacent to the selected flag cell, from among the plurality of dummy cells is performed.

In example embodiments, the nonvolatile memory device further comprises first and second flag bit lines connected to first and second flag cells of the plurality of flag cells, respectively, and first and second dummy bit lines connected to first and second dummy cells of the plurality of dummy cells, respectively, the first and second flag bit lines and the first and second dummy bit lines being disposed in turn.

In example embodiments, the nonvolatile memory device further comprises a first word line connected in common to the first flag cell and the first dummy cell; and a second word line connected in common to the second flag cell and the second dummy cell, wherein there is executed a plurality of program loops in which stepwise increasing program voltages are provided to the first flag cell and the first dummy cell via the first word line, and a program-inhibition voltage is provided to the first dummy cell via the first dummy bit line during at least one program loop of the plurality of program loops.

In example embodiments, when a program-inhibition voltage is provided to the first dummy cell via the first dummy bit line, a power supply voltage is provided to the first flag cell via the first flag bit line.

In example embodiments, there is executed a plurality of program loops in which stepwise increasing program voltages are provided to the second flag cell and the second dummy cell via the second word line, and a power supply voltage is provided to the second flag cell and the second dummy cell via the second flag bit line and the second dummy bit line during the plurality of program loops.

In example embodiments, flag cells, corresponding to the first flag bit line, from among the plurality of flag cells and dummy cells, corresponding to the first flag bit line, from among the plurality of dummy cells form a flag cell string, and flag and dummy cells belonging to the flag cell string are disposed in turn.

In example embodiments, a level of a program voltage provided to the selected flag cell at a time when programming of the selected flag cell is started is lower than a level of a dummy program voltage provided to the at least one dummy cell at a time when the dummy program operation is started.

In example embodiments, at the dummy program operation, a verification read operation for checking whether a threshold voltage of the dummy programmed dummy cell reaches a target voltage is not performed.

Example embodiments of the inventive concept provide a user device including a nonvolatile memory device including a plurality of memory blocks, and a controller configured to control the nonvolatile memory device. Each memory block of the nonvolatile memory device includes a plurality of main bit lines, first and second flag bit lines, and first and second dummy bit lines, and a plurality of word lines intersecting the main bit lines, the first and second flag bit lines, and the first and second dummy bit lines. Each memory block further includes a plurality of main memory cells respectfully connected at intersections between the main bit lines and the word lines, a plurality of flag cells respectively connected at intersections between the word lines and either the first or second flag bit line, and a plurality of dummy cells respectively connected at intersection between the word lines and dummy bit lines, and at intersections between the word lines and either of the first or second flag bit lines. At least one of the dummy cells is interposed between each flag cell and each main memory cell, and between each flag cell and each other flag cell. The controller is configured execute a flag cell programming operation in which a threshold voltage of a flag cell is increased, and is further configured to execute a dummy cell program operation, in response to execution of the flag cell programming operation, in which a threshold voltage of at least one dummy cell adjacent the flag cell is increased.

In example embodiments, each flag cell may be programmed to indicate whether each corresponding word line is LSB programmed or MSB programmed. Further, the flag cell programming operation and the dummy cell programming operation may be executed according to an incremental step pulse program (ISPP), and still further, the ISPP of the dummy cell programming operation may be devoid of a read verification operation. Also, the nonvolatile memory may be a NAND flash memory.

BRIEF DESCRIPTION OF THE FIGURES

The above and other objects and features will become apparent from the description that follows with reference to the accompanying figures, wherein like reference numerals refer to like parts throughout the various figures unless otherwise specified.

DETAILED DESCRIPTION

Figure 1:
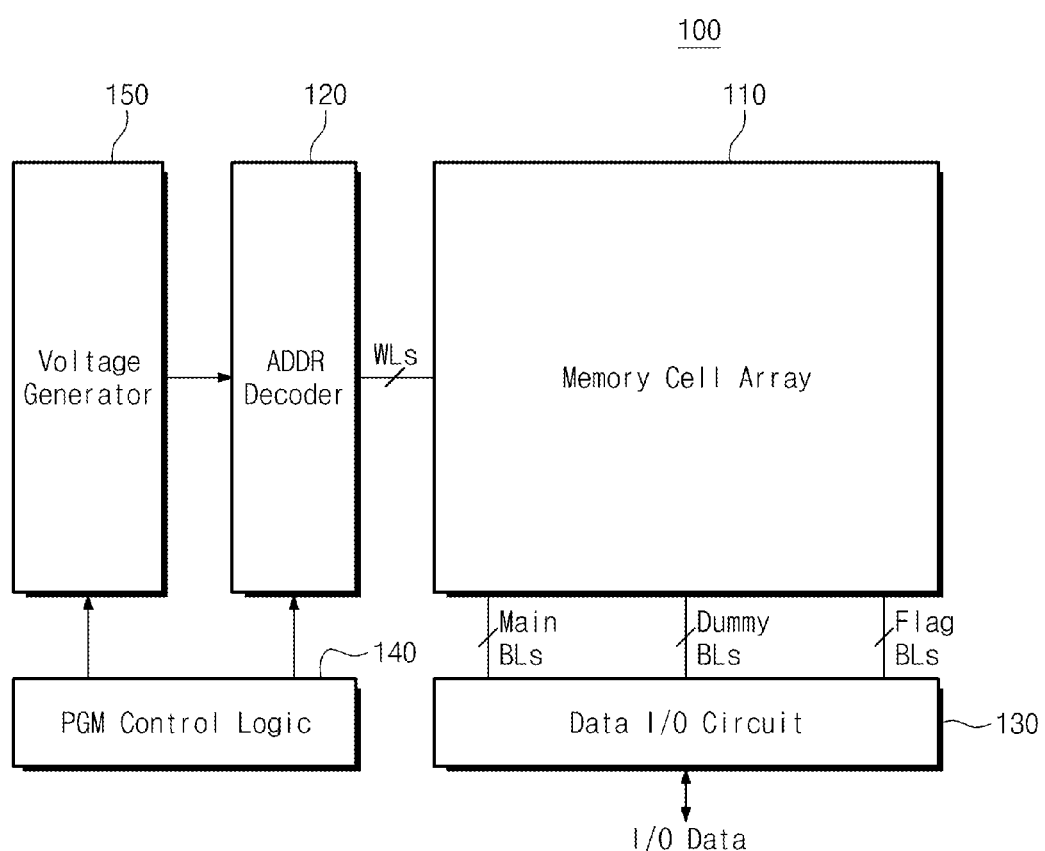
FIG. 1 is a block diagram schematically illustrating a nonvolatile memory device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Below, the inventive concept will be described under the assumption that a nonvolatile memory device of the inventive concept is a NAND flash memory device. However, the inventive concept is not limited thereto. Also, the term "distribution" may be used to indicate the number of memory cells, corresponding to a threshold voltage, from among memory cells in a specific unit (e.g., a page, a block, a chip, etc.). The phrase "adjacent cell" to a predetermined flag cell may be used to describe the inventive concept. Here, an adjacent cell indicates memory cells connected with an adjacent word line of a flag cell or connected with an adjacent bit line of a flag cell.

FIG. 1 is a block diagram schematically illustrating a nonvolatile memory device according to an embodiment of the inventive concept. In a nonvolatile memory device 100, at least one of adjacent cells to a flag cell may be set to a dummy cell. Thus, a threshold voltage of a flag cell may be prevented from being increased due to disturbance. In the event that a flag cell is programmed, at least one of dummy cells adjacent to the programmed flag cell may be programmed to have a predetermined level. Thus, a threshold voltage of a flag cell may be prevented from being lowered due to charge loss.

Referring to FIG. 1, the nonvolatile memory device 100 may include a memory cell array 110, an address decoder 120, a data input/output circuit 130, program control logic 140, and a voltage generator 150.

The memory cell array 110 may include memory cells connected with a bit line and a word line. When a memory cell stores one bit of data, it may be referred to as a single level cell (SLC). When a memory cell stores two or more bits of data, it may be referred to as a multi-level cell (MLC).

Memory cells of the memory cell array 110 may be divided into main memory cells, dummy memory cells, and flag cells. The main memory cells may be connected via main bit lines, and may be used to store user data. The dummy cells may be connected via dummy bit lines or flag bit lines, and may not store meaningful information. The flag cells may be connected via the flag bit lines, and may be used to store flag information indicating whether a corresponding page is LSB programmed or MSB programmed. The structure of the memory cell array 110 will be more fully described later with reference to FIG. 2.

The address decoder 120 may select a word line in response to address information. The address decoder 120 may provide selected word lines with word line voltages from the voltage generator 150. For example, at a program operation, the address decoder 120 may transfer a program voltage or a verification voltage to a selected word line and a pass voltage to an unselected word line.

The data input/output circuit 130 may be connected to the memory cell array 110 via the main bit lines, the dummy bit lines, and the flag bit lines. The data input/output circuit 130 may receive user data from an external device to store it at the memory cell array 110 via the main bit lines. The data input/output circuit 130 may receive user data stored at the memory cell array 110 via the main bit lines to transfer it to the external device. The data input/output circuit 130 may receive flag information via the flag bit lines to transfer it to the external device.

In example embodiments, the data input/output circuit 130 may include well-known constituent elements such as a column gating circuit, a page buffer, data buffer, and the like. In other example embodiments, the data input/output circuit 130 may include well-known constituent elements such as a column gating circuit, a write driver, a sense amplifier, a data buffer, and the like.

The program control logic 140 may control an overall operation of the nonvolatile memory device 100. For example, the program control logic 140 may set at least one of adjacent cells on a flag cell to a dummy cell. When a flag cell is programmed, the program control logic 140 may program at least one of dummy cells adjacent to flag cells to have a predetermined level.

The voltage generator 150 may generate voltages under the control of the program control logic 140. The voltage generator 150 may provide voltages for a program operation of the nonvolatile memory device 100 in response to the control of the program control logic 140.

Figure 2:
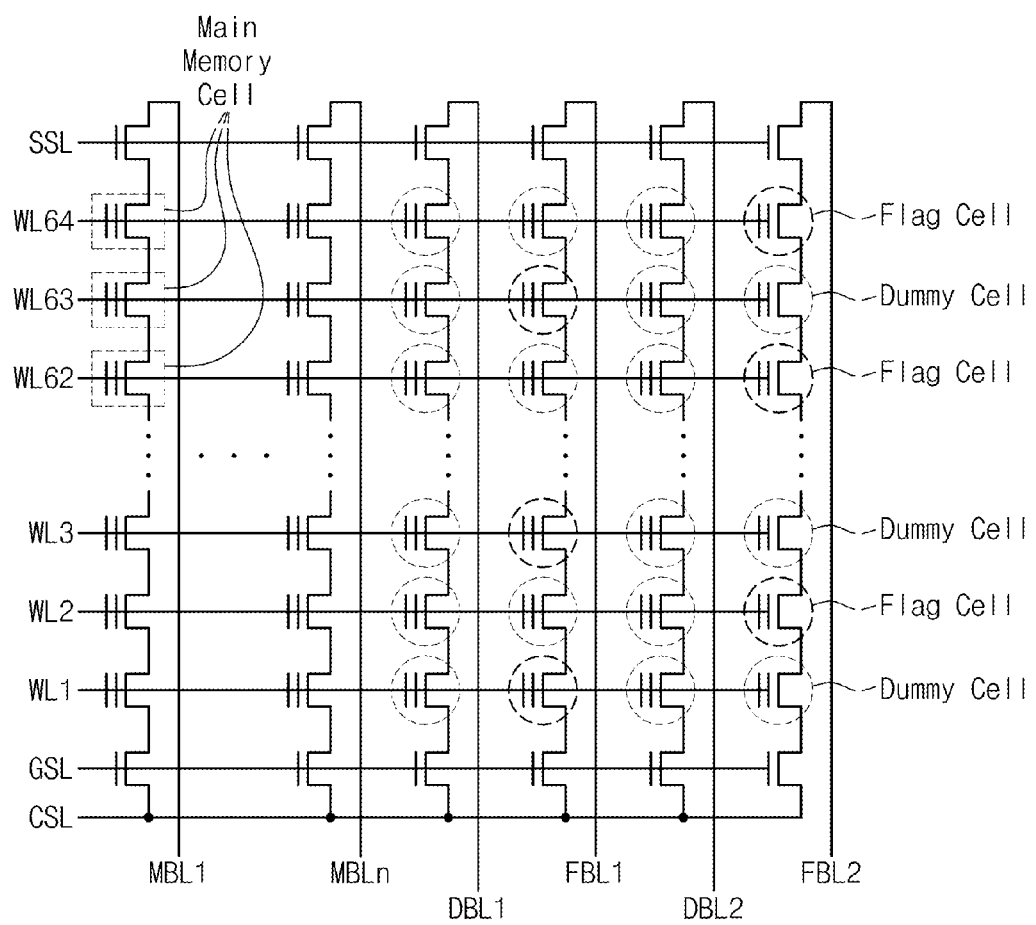
FIG. 2 is a diagram illustrating a memory cell array shown in FIG. 1 according to an embodiment of the inventive concept.

FIG. 2 is a diagram illustrating a memory cell array in FIG. 1 according to an embodiment of the inventive concept. For ease of description, a memory cell array 110 in FIG. 2 may be assumed to include flash memory cells. Referring to FIG. 2, the memory cell array 110 may include a plurality of string selection transistors SST, a plurality of ground selection transistors GST, and a plurality of flash memory cells. The plurality of flash memory cells may be divided into main memory cells, dummy memory cells, and flag cells.

A gate of each string selection transistor SST may be connected to an address decoder 120 via a string selection line SSL, and a drain thereof may be connected to a data input/output circuit 130 via a corresponding one of bit lines (e.g., main, dummy, and flag bit lines). A gate of each ground selection transistor GST may be connected to the address decoder 120 via a ground selection line GSL.

The flash memory cells may be connected to the address decoder 120 via corresponding word lines. In an SLC manner in which one bit is stored at a memory cell, a group of flash memory cells connected to a same word line may form a page.

In an MLC manner in which plural bits are stored at a memory cell, a group of flash memory cells connected to a same word line may form a plurality of pages. Below, it is assumed that one flash memory cell stores 2-bit data and that accordingly two pages of data are stored in the memory cells of each word line.

The main memory cells may be connected to the main bit lines MBL1 to MBLn, and may store user data transferred from an external device. The flag cells may be connected to flag bit lines FLB1 and FBL2, and may store flag information indicating whether main memory cells (or, a page) connected via the same word line are LSB programmed or MSB programmed.

The dummy cells may be disposed around flag cells. That is, as illustrated in FIG. 2, as first and second dummy bit lines DBL1 and DBL2 and first and second flag bit lines FBL1 and FBL2 are disposed in turn, a cell adjacent to each flag cell in a row direction may be determined as a dummy cell. Also, as flag cells and dummy cells are alternately connected to the same flag bit line, a cell adjacent to each flag cell in a column direction may be determined as a dummy cell.

As dummy cells are disposed around a flag cell, a threshold voltage of the flag cell may be prevented from being increased inadvertently (e.g., due to program disturbance). Thus, it is possible to prevent a read error which would otherwise be caused when a threshold voltage of a flag cell is increased inadvertently. This will be more fully described with reference to FIGS. 3 to 7.

In other example embodiments, in the event that a flag cell is programmed, at least one of dummy cells adjacent to the flag cell to be programmed may be programmed to have a predetermined level. Thus, it is possible to prevent a read error which would otherwise be caused when a threshold voltage of a flag cell is decreased inadvertently. This will be more fully described with reference to FIGS. 8 to 13.

The memory cell array 110 is assumed by way of example to include flash memory cells. However, the inventive concept is not limited thereto. For example, the memory cell array 110 in FIG. 2 may be formed of various nonvolatile memory elements such as Magnetic RAM (MRAM), Spin-Transfer Torque MRAM, Conductive bridging RAM (CBRAM), Ferroelectric RAM (FeRAM), Phase RAM (PRAM) called OUM (Ovonic Unified Memory), Resistive RAM (RRAM or Re-RAM), Nanotube RAM, Polymer RAM (PoRAM), Nano Floating Gate Memory (NFGM), holographic memory, Molecular Electronics Memory, Insulator Resistance Change Memory, and the like.

For ease of illustration, there is illustrated an example in which the memory cell array 110 includes two dummy bit lines and two flag bit lines. However, the inventive concept is not limited thereto. For example, the memory cell array 110 may be configured to include one flag bit line and one dummy bit line.

For ease of description, it is assumed that memory cells of the nonvolatile memory device 100 in FIG. 1 are NAND flash memory cells as illustrated in FIG. 2 and each NAND flash memory cell stores 2-bit data. Also, it is assumed that 2-bit data is divided into LSB data and MSB data. For example, when a NAND flash memory cell stores 2-bit data of '10', the lower bit '0' thereof may be LSB data and the upper bit '1' thereof may be MSB data.

Figure 3:
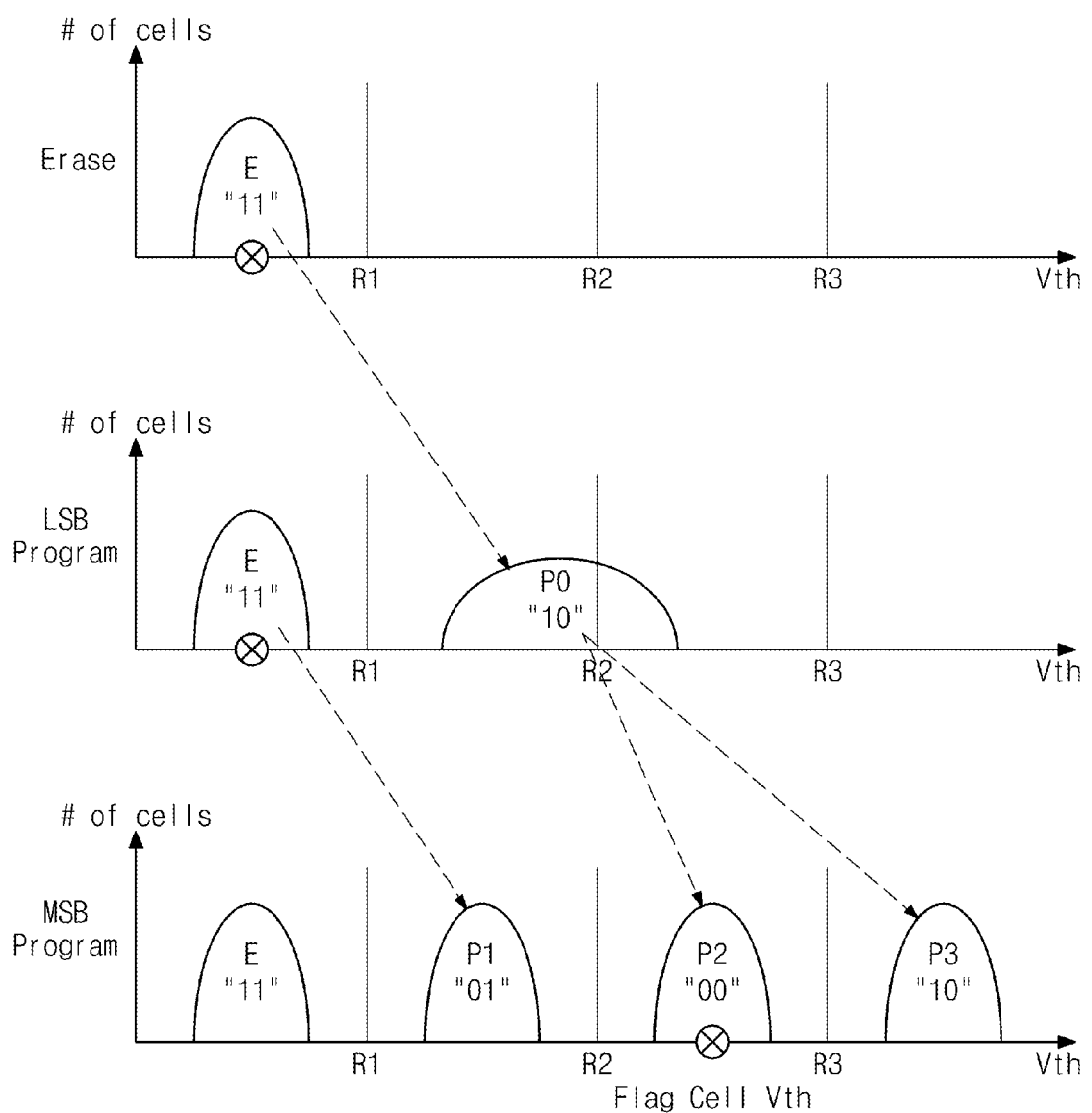
FIG. 3 is a diagram illustrating a program method of a nonvolatile memory device shown in FIG. 1.

FIG. 3 is a diagram illustrating a program method of a nonvolatile memory device in FIG. 1.

A program operation for storing 2-bit data at a main memory cell (hereinafter, referred to as a 2-bit main memory cell) may be divided into an LSB program operation and an MSB program operation. That is, a 2-bit main memory cell may experience an MSB program operation following an LSB program operation. A 2-bit main memory cell will be programmed as follows.

Referring to FIG. 3, it is assumed that initially a threshold voltage of the main memory cells is an erase state E corresponding to data of '11'. Then, an LSB programming is carried out to program the LSB of the data. If the LSB is "0", the threshold voltage the main memory cells are programmed to the state P0. On the other hand, if the LSB is "1", the threshold voltage of the main memory cells remains in the erase state E.

Then, referring to the MSB program case that main memory cells are MSB programmed, if an MSB program operation is performed, main memory cells having the initial program state P0 may be programmed to have a second program state P2 or a third program state P3. In this case, main memory cells having the second program state P2 may correspond to data of '00', and main memory cells having the third program state P3 may correspond to data of '10'.

Also, if the MSB program operation is performed, main memory cells having the erase state E may keep the erase state E or be programmed to have a first program state P1. In this case, main memory cells having the first program state P1 may correspond to data of '01'.

As described with reference to FIGS. 1 and 2, a flag cell may store flag information indicating whether a corresponding page is LSB programmed or MSB programmed. That is, whether a corresponding page is LSB programmed or MSB programmed may be judged according to a level of a threshold voltage of a flag cell.

For example, when a page is LSB programmed, a flag cell corresponding to the LSB-programmed page may have a threshold voltage corresponding to the erase state E. In the event that a threshold voltage of a flag cell is lower than a voltage R1 or R2, a page including the flag cell may be judged to be LSB programmed.

In other example embodiments, if a page is MSB programmed, a flag cell corresponding to the MSB-programmed page may have a threshold voltage corresponding to the second program state P2. In the event that a threshold voltage of a flag cell is higher than the voltage R2, a page including the flag cell may be judged to be MSB programmed. LSB and MSB read operations using a flag cell will be described with reference to FIGS. 4 and 5.

Figure 4:
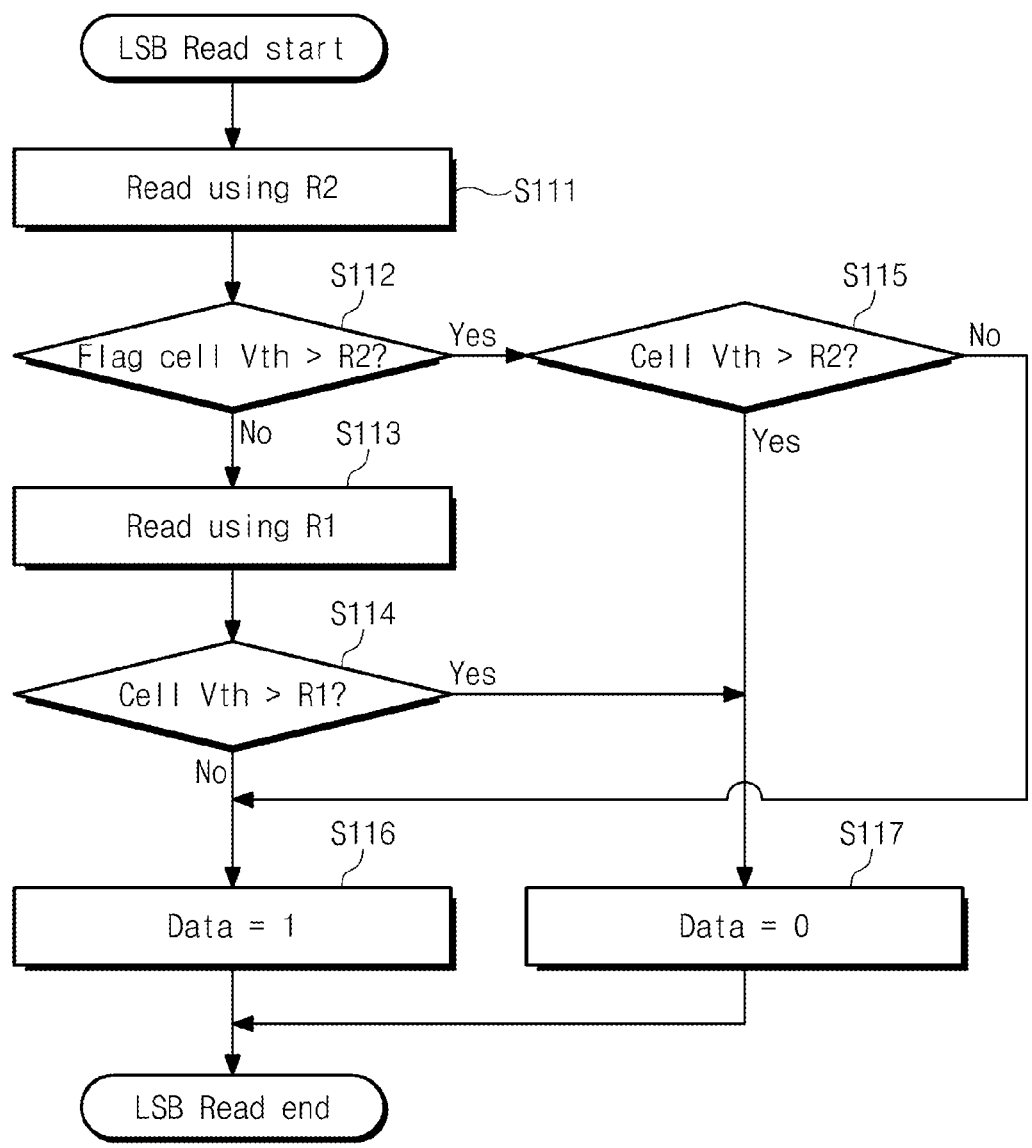
FIG. 4 is a flowchart illustrating an LSB read operation of a nonvolatile memory device shown in FIG. 1.

FIG. 4 is a flowchart illustrating an LSB read operation of a nonvolatile memory device in FIG. 1. Below, an LSB read operation of a nonvolatile memory device according to an embodiment of the inventive concept will be more fully described with reference to FIGS. 3 and 4.

In operation S111, a nonvolatile memory device 100 may judge an LSB read operation according to a read command and an address provided from an external device, and may read data in a page including main memory cells to be read using a second read voltage R2. The page may include a flag cell indicating whether it is LSB programmed or MSB programmed.

In operation S112, whether a threshold voltage of a flag cell is higher than the second read voltage R2 may be judged. In the event that a page is only LSB programmed (i.e., in the case where no MSB program operation is performed), a threshold voltage of a flag cell may be lower than the second read voltage R2. On the other hand, in the case where a page is MSB programmed, a threshold voltage of a flag cell may be higher than the second read voltage R2.

If a threshold voltage of a flag cell is lower than the second read voltage R2, in operation S113, the nonvolatile memory device 100 may read data of the page using a first read voltage R1. That is, in a case where a page is LSB programmed, the nonvolatile memory device 100 may again read data of the page using the first read voltage R1.

In operation S114, whether threshold voltages of memory cells in the page are larger than the first read voltage R1 may be judged. The nonvolatile memory device 100 may judge LSB data of a main memory cell by judging whether a threshold voltage of the main memory cell is larger than the first read voltage R1.

When a threshold voltage of the main memory cell is larger than the first read voltage R1, in operation S117, LSB data of the main memory cell may be judged to be '0'. When a threshold voltage of the main memory cell is smaller than the first read voltage R1, in operation S116, LSB data of the main memory cell may be judged to be '1'.

If a threshold voltage of the flag cell is larger than the second read voltage R2, in operation S115, whether threshold voltages of memory cells in the page are larger than the second read voltage R2 may be judged. That is, in a case where a page is MSB programmed, whether a threshold voltage of a main memory cell to be read is larger than the second read voltage R2 may be judged.

When a threshold voltage of the main memory cell is larger than the second read voltage R2, in operation S117, LSB data of the main memory cell may be judged to be '0'. When a threshold voltage of the main memory cell is smaller than the second read voltage R2, in operation S116, LSB data of the main memory cell may be judged to be '1'.

Figure 5:
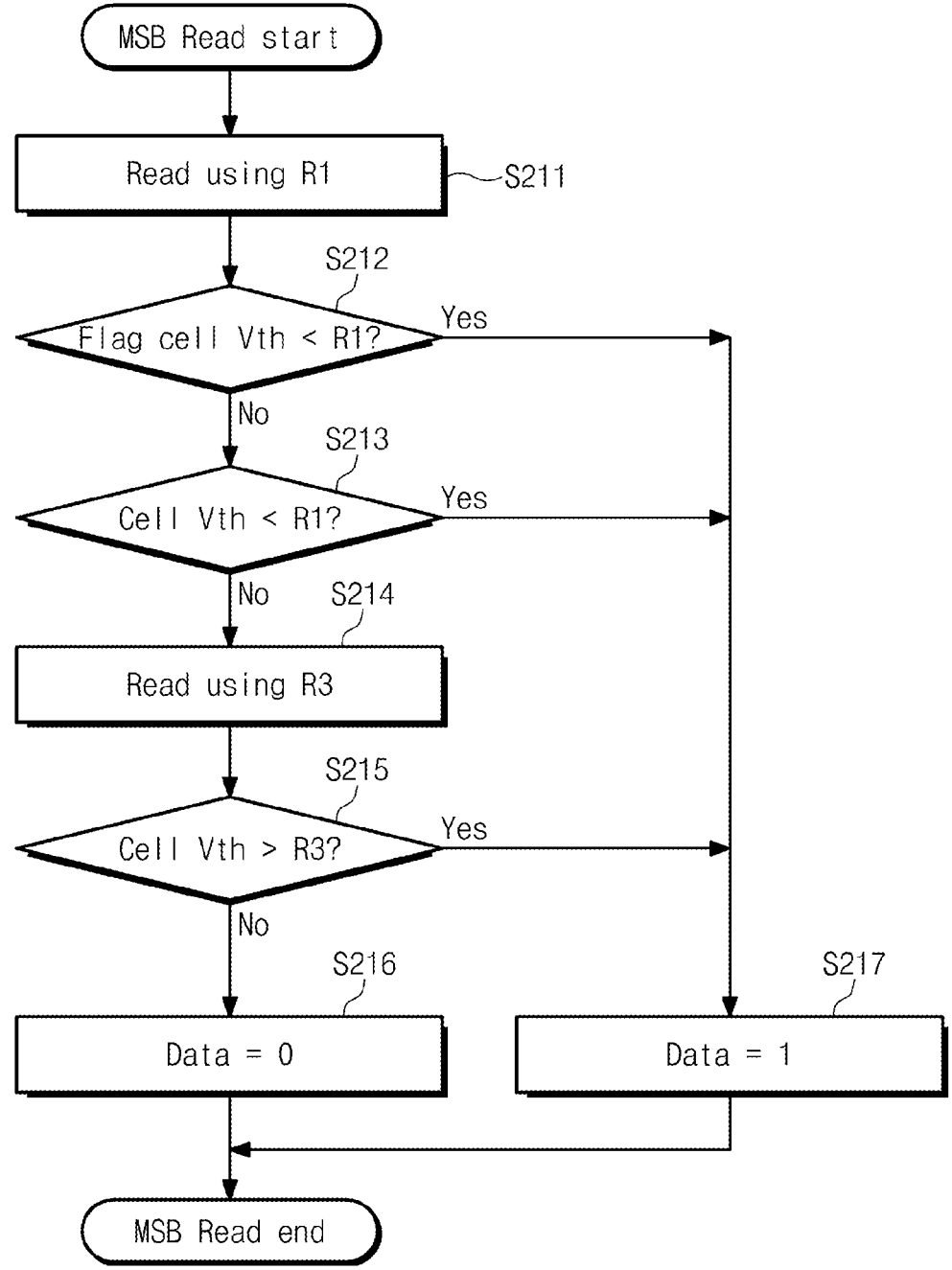
FIG. 5 is a flowchart illustrating an MSB read operation of a nonvolatile memory device shown in FIG. 1.

FIG. 5 is a flowchart illustrating an MSB read operation of a nonvolatile memory device in FIG. 1. Below, an MSB read operation of a nonvolatile memory device in FIG. 1 will be more fully described with reference to FIGS. 3 and 5.

In operation 5211, a nonvolatile memory device 100 may execute an MSB read operation according to a read command and an address provided from an external device, and may read data in a page including main memory cells to be read using a first read voltage R1. The page may include a flag cell indicating whether it is LSB programmed or MSB programmed.

In operation 5212, whether a threshold voltage of a flag cell is smaller than the first read voltage R1 may be judged. In the event that a page is only LSB programmed (i.e., in the case where no MSB program operation is performed), a threshold voltage of a flag cell may be lower than the first read voltage R1. On the other hand, in the case where a page is MSB programmed, a threshold voltage of a flag cell may be higher than the first read voltage R1.

If a threshold voltage of a flag cell is lower than the first read voltage R1, the page may be judged only to be LSB programmed. That is, a main memory cell to be read may be judged to correspond to an erase state E or an initial program state P0. Thus, in operation S217, MSB data of the main memory cell to be read may be judged to be '1'.

If a threshold voltage of the main memory cell to be read is larger than the first read voltage R1, in operation 5213, a threshold voltage of the main memory cell to be read may be judged to be smaller than the first read voltage R1.

If a threshold voltage of the main memory cell to be read is smaller than the first read voltage R1, the main memory cell may be judged to correspond to a first program state P1. Thus, in operation S217, MSB data of the main memory cell to be read may be judged to be '1'.

When a threshold voltage of a main memory cell is not smaller than the first read voltage R1, in operation S214, the nonvolatile memory device 100 may again read the page using a third read voltage R3.

In operation S215, whether a threshold voltage of a main memory cell to be read is larger than the third read voltage R3 may be judged.

If a threshold voltage of a main memory cell to be read is larger than the third read voltage R3, the main memory cell may be judge to have a third program state. Thus, in operation S217, MSB data of the main memory cell to be read may be judged to be '1'.

If a threshold voltage of a main memory cell to be read is smaller than the third read voltage R3, the main memory cell may be judge to have a first or second program state. Thus, in operation S216, MSB data of the main memory cell to be read may be judged to be '0'.

As described with reference to FIGS. 4 and 5, flag information stored at a flag cell may be used during both an LSB read operation and an MSB read operation. Thus, a threshold voltage of a flag cell may be stably maintained to secure the reliability of a read operation.

However, a threshold voltage of a flag cell may be inadvertently changed due to various factors (e.g., read voltage disturbance, write voltage disturbance, coupling, power-off, etc.). For example, a threshold voltage of a flag cell may be inadvertently increased due to program disturbance and decreased due to charge loss.

Figure 6:
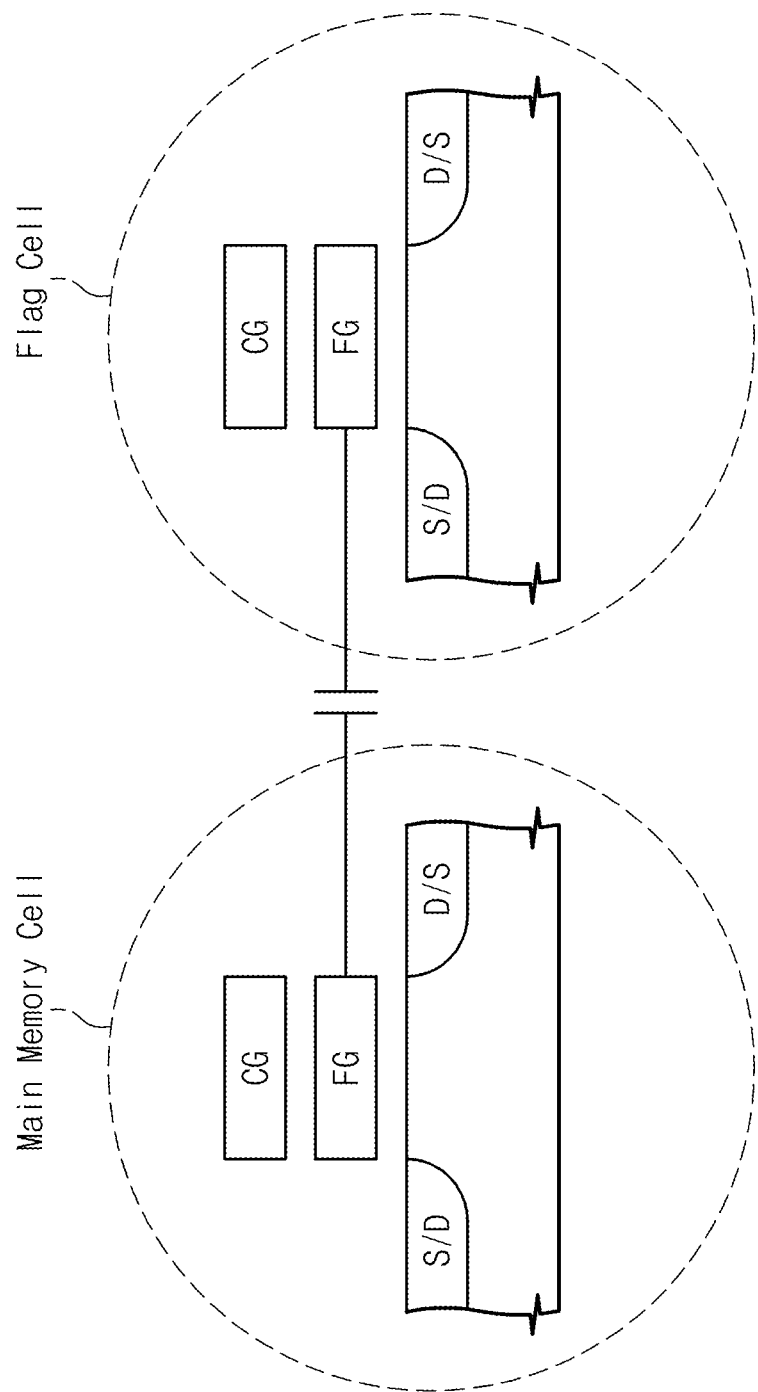
FIGS. 6 and 7 are diagrams illustrating an example in which a threshold voltage of a flag cell increases due to program disturbance.
Figure 7:
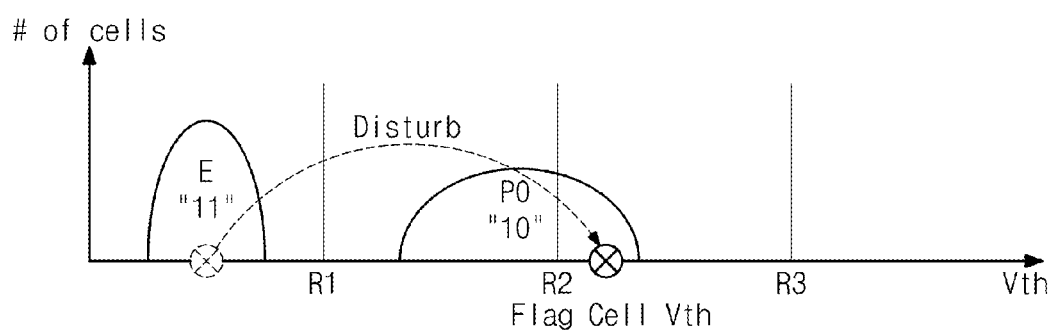

FIGS. 6 and 7 are diagrams illustrating an example in which a threshold voltage of a flag cell increases due to program disturbance. It is assumed that adjacent cells on a flag cell are main memory cells.

Referring to FIG. 6, in the case where an adjacent cell of a flag cell is a main memory cell, a floating gate of the flag cell and a floating gate of the main memory cell may be coupled. In this case, when the main memory cell is programmed, a threshold voltage of the flag cell may be increased as if charges are accumulated at the floating gate of the flag cell.

The main memory cell may be programmed according to an ISPP (Incremental Step Pulse Program) scheme in which a program operation is executed using a stepwise increasing program voltage. Since the flag cell is continuously affected during a plurality of program loops, a threshold voltage of the flag cell may be further increased.

With the above description, a threshold voltage of the flag cell may be increased up to a level higher than that of a second read voltage R2. This may cause a read error during an LSB read operation and/or an MSB read operation.

In the case of a nonvolatile memory device according to an embodiment of the inventive concept, cells adjacent to a flag cell may be set to dummy cells to prevent a read error. That is, read error caused by an increase in a threshold voltage of a flag cell may be prevented by setting cells adjacent to a flag cell as dummy cells.

As described with reference to FIGS. 1 and 2, a dummy cell may be a flash memory cell which does not store meaningful information, and its threshold voltage may be variously determined. However, as will be described in FIGS. 8 and 9, when a dummy cell has a threshold voltage corresponding to an erase state, a threshold voltage of a flag cell may be reduced due to charge loss.

Figure 8:
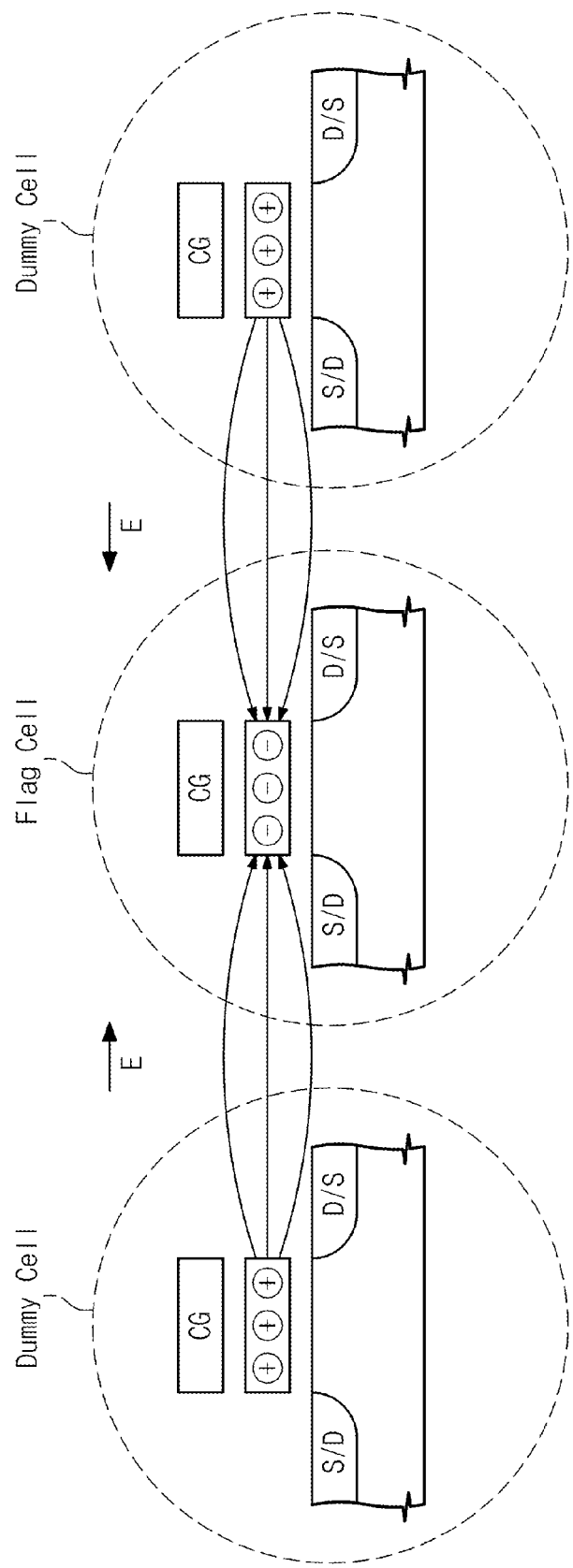
FIGS. 8 and 9 are diagrams illustrating an example in which a threshold voltage is decreased due to charge loss.
Figure 9:
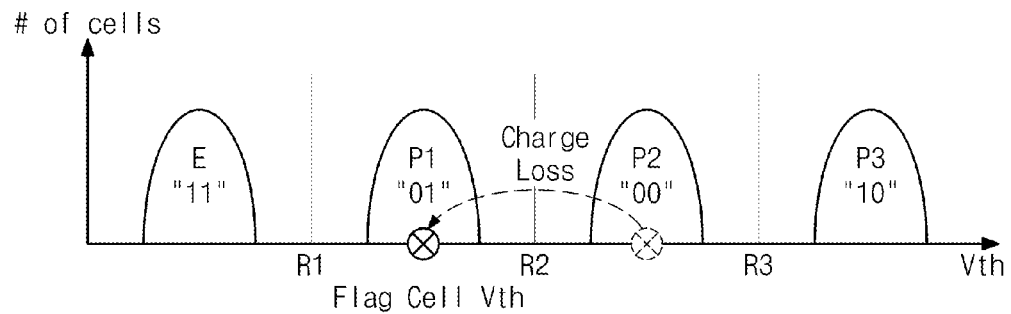

FIGS. 8 and 9 are diagrams illustrating an example in which a threshold voltage is decreased due to charge loss. It is assumed that a flag cell has a third program state P3 (refer to FIG. 3) and dummy cells adjacent to the flag cell have threshold voltages corresponding to an erase state E (refer to FIG. 3).

Referring to FIG. 8, a flag cell may be programmed to have the third program state P3, and dummy cells adjacent to the flag cell may be at erase state E. Compared with dummy cells, more negative charges may exist at a floating gate of the flag cell. Compared with the flag cell, more positive charges may exist at floating gates of the dummy cells. Thus, as illustrated in FIG. 8, an electric field may be formed between the flag cell and the dummy cells due to a potential difference there between.

In this case, negative charges accumulated at the floating gate of the flag cell may be leaked out due to the electric field. That is, the flag cell may experience charge loss. Thus, as illustrated in FIG. 9, a threshold voltage of the flag cell may be lowered to a threshold voltage level of a first program state P1 from a threshold voltage level of a second program state P2. This may cause a read error during an LSB read operation and/or an MSB read operation.

To prevent a decrease in a threshold voltage due to the charge loss, the nonvolatile memory device 100 of the inventive concept may program at least one of dummy cells adjacent to a flag cell to have a predetermined voltage level. This will be more fully described with reference to FIGS. 10 to 13.

Figure 10:
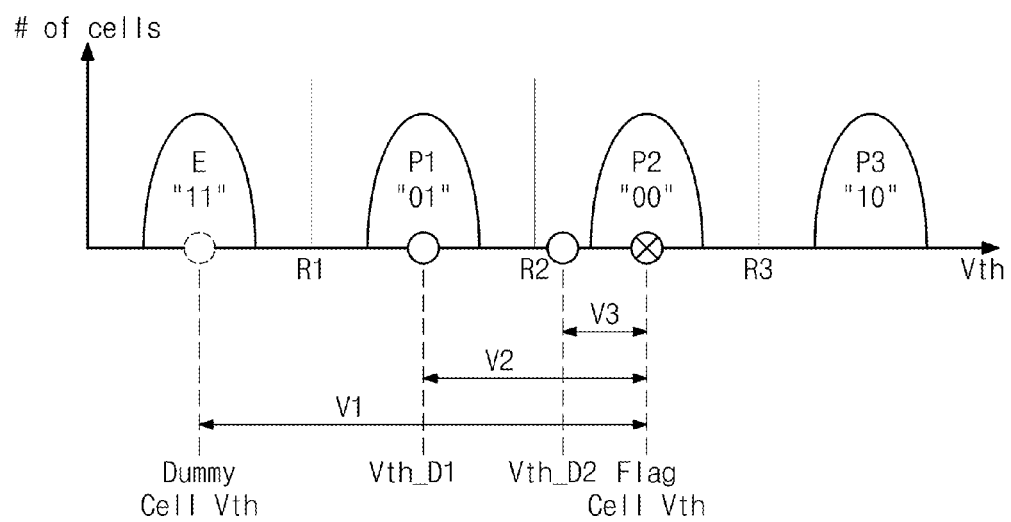
FIG. 10 is a diagram illustrating an effect of the inventive concept when dummy cells are programmed.

FIG. 10 is a diagram illustrating an effect of the inventive concept when dummy cells are programmed. It is assumed that a flag cell is programmed to have a second program state P2. An operation of programming a dummy cell may be referred to as a dummy program operation.

Referring to FIG. 10, a potential difference between a dummy cell and a flag cell may correspond to V1 when a dummy cell is at an erase state E. The potential difference of V1 may cause a decrease in a threshold voltage of a flag cell due to charge loss as described with reference to FIGS. 8 and 9.

If a threshold voltage of a dummy cell is increased by a first voltage Vth_D1, a potential difference between the dummy cell and the flag cell may be V2 which is smaller than V1. If a threshold voltage of a dummy cell is increased by a second voltage Vth_D2, a potential difference between the dummy cell and the flag cell may be V3 which is smaller than V2. Thus, if a dummy cell is programmed to have a predetermined voltage, it is possible to effectively prevent a decrease in a threshold voltage of a flag cell due to charge loss.

In example embodiments, a voltage level of a dummy cell may be variously set. For example, as illustrated in FIG. 10, the dummy cell may be programmed to have a threshold voltage level which is higher than a voltage level of an erase state and lower than a voltage level of a second program state P2. Alternatively, if a flag cell is at a third program state, the dummy cell may be programmed to have a threshold voltage level which is higher than a voltage level of an erase state and lower than a voltage level of the third program state P3.

The number of dummy cells to be dummy programmed may be variously determined. For example, in the case where a flag cell is programmed to have a voltage of a state, eight dummy cells on the flag cell may be all dummy-programmed. Alternatively, in the case where a flag cell is programmed to have a voltage of a state, at least one dummy cell on the flag cell may be dummy-programmed.

Dummy cells may be dummy-programmed by various methods. This will be more fully described with reference to FIGS. 11 to 14.

FIGS. 11 to 14 are diagrams illustrating dummy program methods according to embodiments of the inventive concept.

Figure 11:
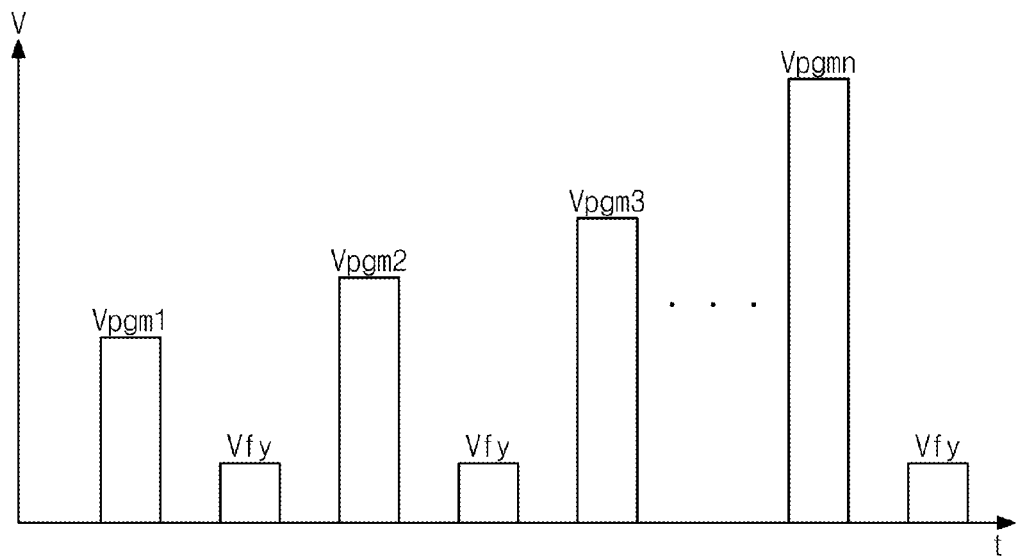
FIGS. 11, 12, 13 and 14 are diagrams illustrating dummy program methods according to an embodiment of the inventive concept.

Referring to FIG. 11, dummy cells may be dummy-programmed according to an ISPP scheme. That is, a dummy cell may be programmed by applying stepwise increasing program voltages Vpgm1 to Vpgmn to the dummy cell.

A dummy program operation of a dummy cell may be executed at the same time with a program operation of an adjacent flag cell. That is, the stepwise increasing program voltages Vpgm1 to Vpgmn may be applied to a word line connected in common with a flag cell and a dummy cell under the condition that a ground voltage is applied to a dummy bit line of the dummy cell adjacent to a flag bit line of the flag cell. An inadvertent increase in a threshold voltage due to the coupling between the flag cell and the dummy cell may be minimized by programming the flag cell and the dummy cell at the same time.

Alternatively, after the flag cell is programmed, the dummy cell may be dummy-programmed. Still alternatively, after the dummy cell is dummy-programmed, the flag cell may be programmed.

Figure 12:
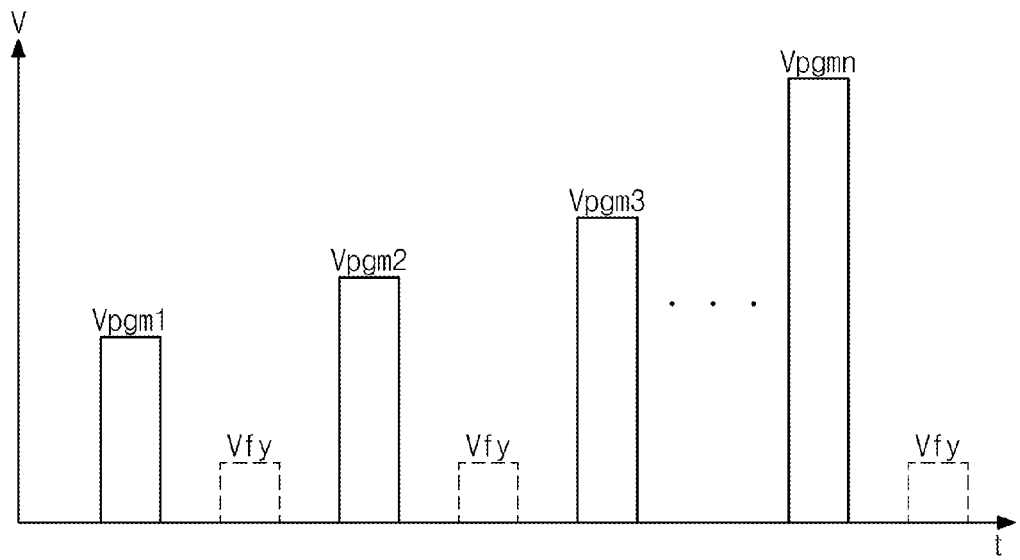

During a dummy program operation according to an embodiment of the inventive concept, a verification read operation may be skipped as illustrated in FIG. 12. That is, at the dummy program operation, a verification read voltage Vfy may not be provided to the dummy cell. Omission of the verification read operation is permitted because the dummy cell is not used to store meaningful information.

In detail, the dummy cell may not be used to store meaningful information, and the dummy program operation may be performed to reduce a potential difference between the dummy cell and the flag cell, not to store data at the dummy cell. For this reason, in the case where the dummy cell is dummy-programmed to have a predetermined target voltage, an error between a threshold voltage of a dummy-programmed dummy cell and a target voltage may be allowed. For this reason, as illustrated in FIG. 12, the dummy program operation may be iterated by a predetermined program loop number without execution a verification read operation within each loop.

The number of program loops on the dummy cell may be set to be equal to that on the flag cell. It is assumed that the dummy program operation and a program operation on a flag cell are executed at the same time. With this assumption, if a program operation on the flag cell is passed, a dummy program operation on a dummy cell corresponding to the program-passed flag cell may be ended at the same time. Also, in the case where all program loops associated with the flag cell are executed, a dummy program operation on a dummy cell corresponding to the program-passed flag cell may be ended at the same time. The dummy program operation may be determined so as to be performed by a predetermined program loop number regardless of whether a flag cell is program-passed.

Meanwhile, the number of program loops on the dummy cell may be different from that on the flag cell. In this case, if a program operation on the flag cell is ended, a program operation of a dummy cell corresponding to the flag cell may be ended at the same time. Alternatively, when a program operation on the flag cell is ended, a program operation of a dummy cell corresponding to the flag cell may be ended after it is further performed by a predetermined program loop number. Still alternatively, the dummy program operation may be determined so as to be performed by a predetermined program loop number regardless of a program operation on the flag cell.

Figure 13:
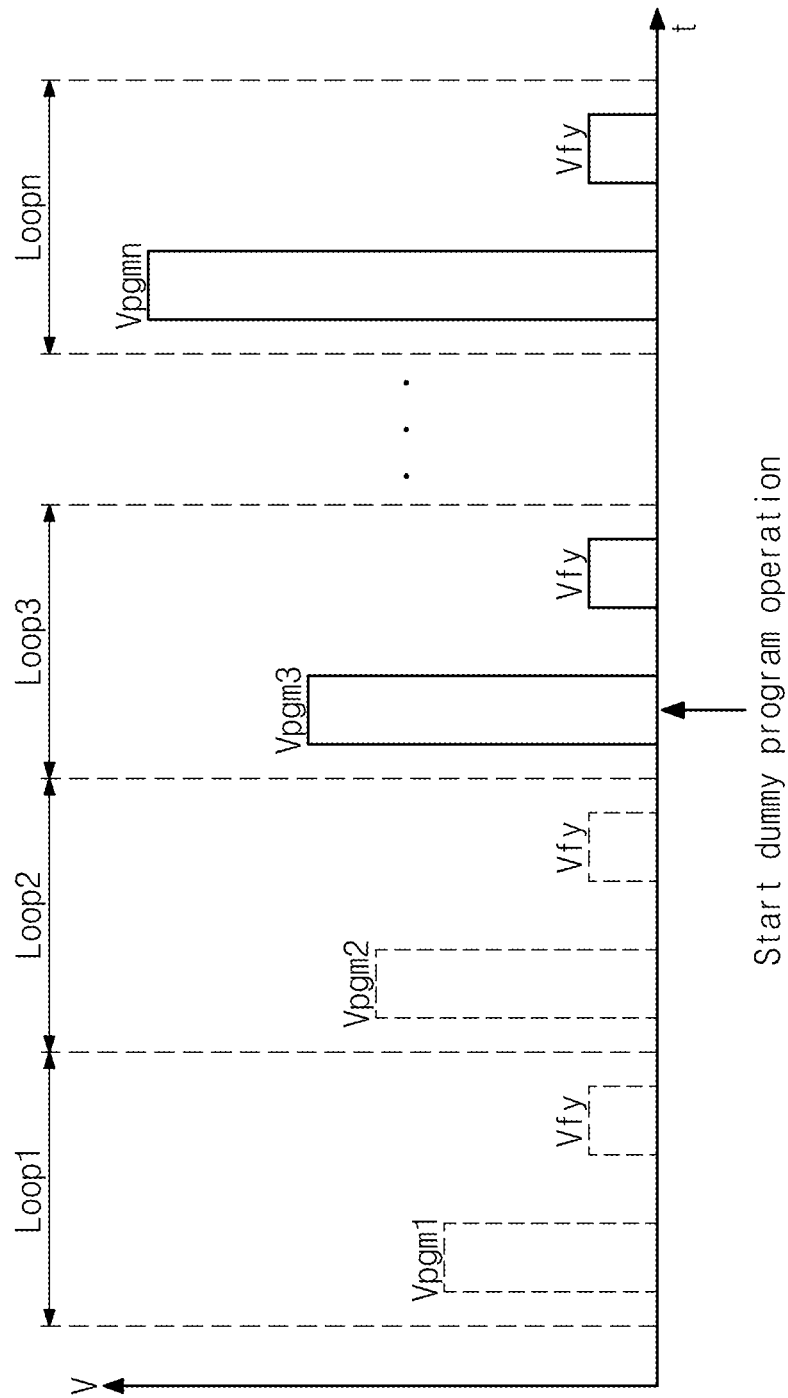

In the inventive concept, referring to FIG. 13, a portion of ISPP loops associated with the dummy program operation may be skipped. For example, as illustrated in FIG. 13, first and second program loops may be skipped at the dummy program operation. As described with reference to FIG. 12, the reason may be that an error between a threshold voltage of a dummy-programmed dummy cell and a target voltage is allowed.

In detail, if program voltages are provided to the dummy and flag cells according the same ISPP scheme, during the first and second program loops, a program inhibition voltage Vinhibit may be applied to a dummy bit line of the dummy cell, and a ground voltage may be applied to a flag bit line of the flag cell. This may mean that the number of program loops ((n−2) program loops) at a dummy program operation on the dummy cell is different from the number of program loops (n program loops) at a program operation on the flag cell. Also, this may mean that a level Vpgm3 of a program voltage at a time when a dummy program operation is actually started is different from a level Vpgm1 of a program voltage at a time when a program operation on the flag cell is started.

Figure 14:
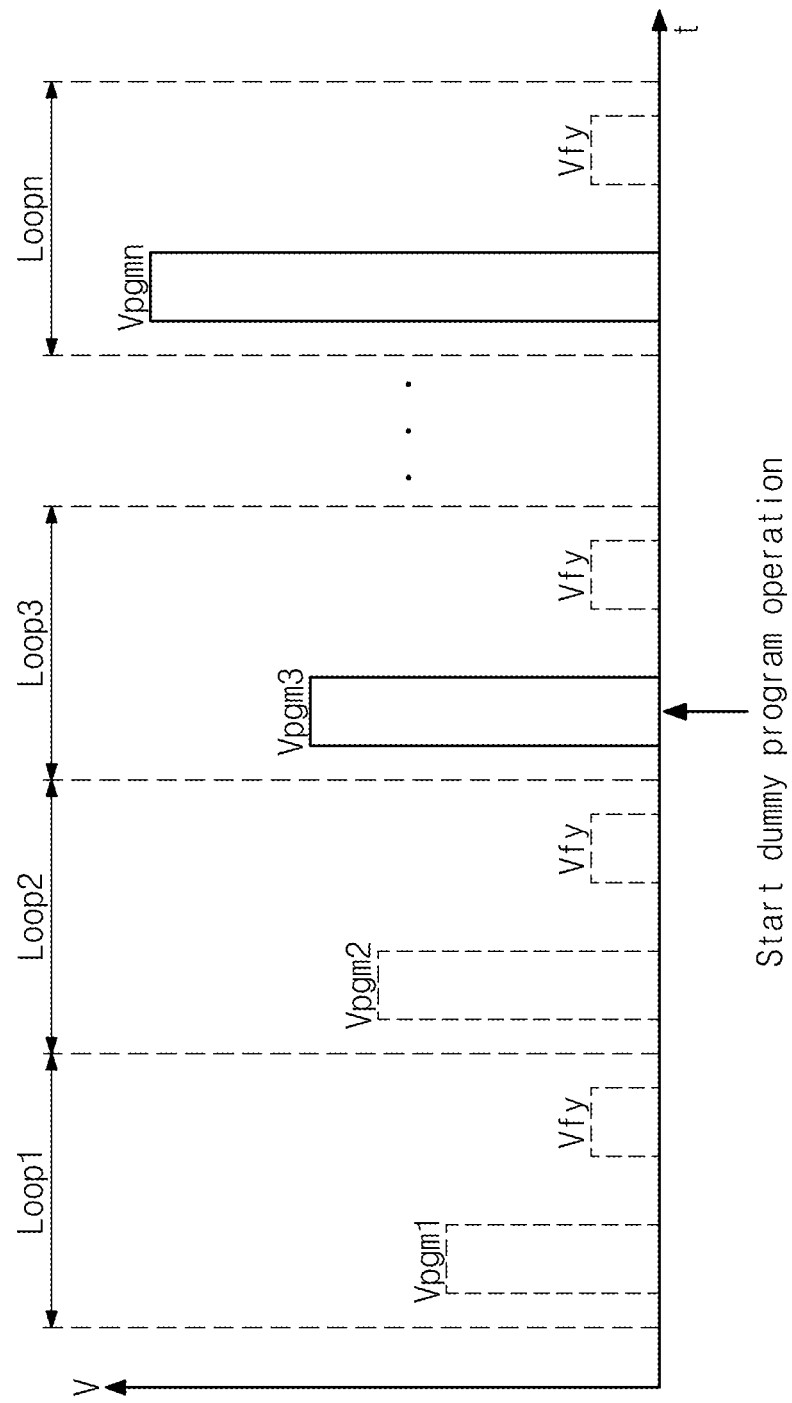

Referring to FIG. 14, at a dummy program operation, a verification read operation may not be performed, and a portions of ISPP loops may be skipped. For example, as illustrated in FIG. 14, when the dummy program operation is executed, first and second program loops may be skipped. At the same time, verification read operations of third to nth program loops may be skipped.

As described above, the nonvolatile memory device 100 according to the inventive concept may prevent a threshold voltage of a flag cell from being increased inadvertently by setting at least one of cells adjacent to the flag cell as a dummy cell. Also, the nonvolatile memory device 100 may prevent a threshold voltage of the flag cell from being decreased inadvertently by programming at least one of dummy cells adjacent to the programmed flag cell to have a predetermined level.

In FIGS. 12 to 14, skipping of a verification read operation may be applied to a dummy program operation. However, the inventive concept is not limited thereto. For example, skipping of a verification read operation may be applied to both the dummy program operation and a program operation on a main cell and/or a flag cell.

In FIGS. 13 and 14, skipping of program loops may be applied to a dummy program operation. However, the inventive concept is not limited thereto. For example, skipping of program loops may be applied to both the dummy program operation and a program operation on a main cell and/or a flag cell.

It is assumed that 1-bit data is stored at a first cell and 2-bit data is stored at a second cell. Also, it is assumed that an ISPP scheme having the same threshold voltage increment and program number is applied to first and second main cells. With this assumption, a read margin of the first cell may be larger than that of the second cell. Thus, during a program operation of the first cell, a portion of the program loops may be skipped. Herein, each of the first and second cells may be one of a main cell, a flag cell, and a dummy cell.

Figure 15:
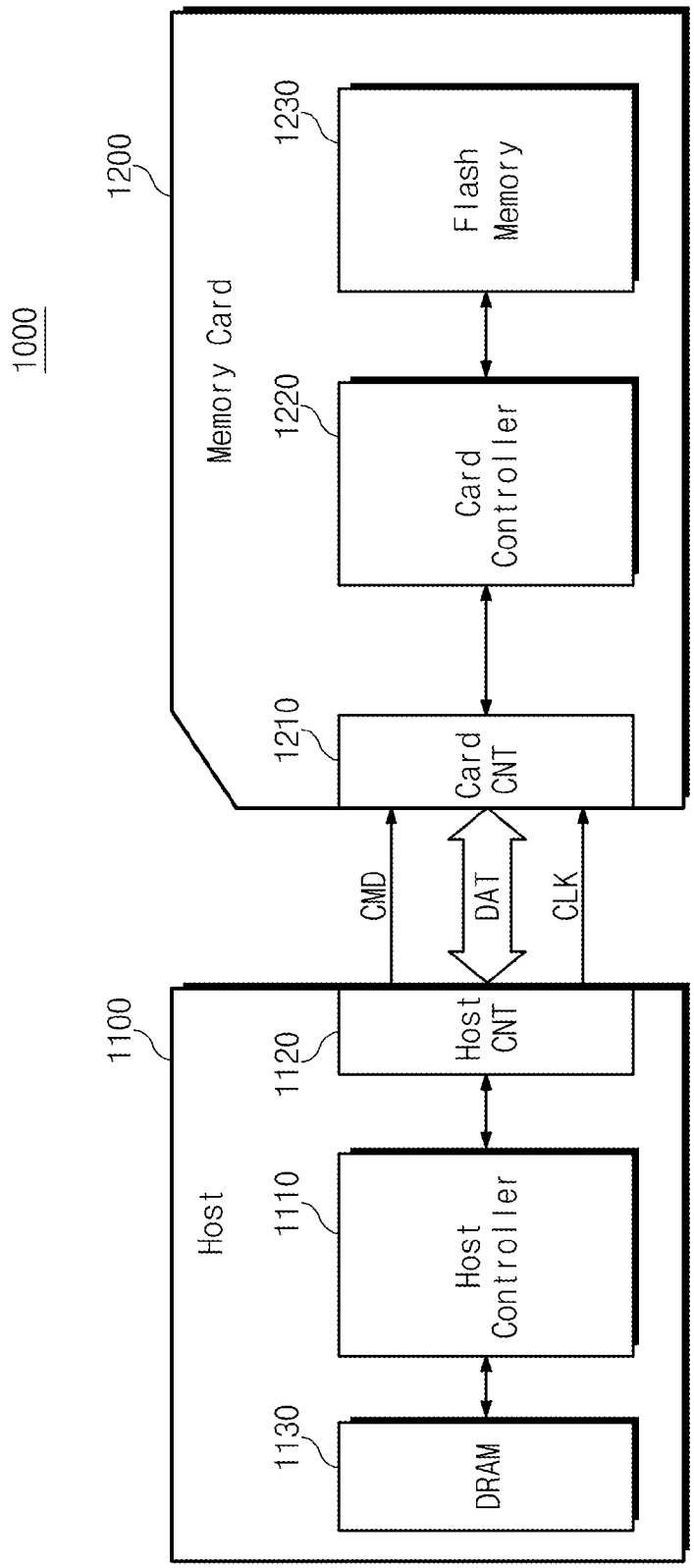
FIG. 15 is a block diagram schematically illustrating a memory card system to which a flash memory system according to an embodiment of the inventive concept is applied.

FIG. 15 is a block diagram schematically illustrating a memory card system to which a flash memory system according to an embodiment of the inventive concept is applied. A memory card system 1000 may include a host 1100 and a memory card 1200. The host 1100 may include a host controller 1110, a host connection unit 1120, and a DRAM 1130.

The host 1100 may write data in the memory card 1200 and read data from the memory card 1200. The host controller 1110 may send a command (e.g., a write command), a clock signal CLK generated from a clock generator (not shown) in the host 1100, and data to the memory card 1200 via the host connection unit 1120. The DRAM 1130 may be a main memory of the host 1100.

The memory card 1200 may include a card connection unit 1210, a card controller 1220, and a flash memory 1230. The card controller 1220 may store data in the flash memory 1230 in response to a command input via the card connection unit 1210. The data may be stored in synchronization with a clock signal generated from a clock generator (not shown) in the card controller 1220. The flash memory 1230 may store data transferred from the host 1100. For example, in a case where the host 1100 is a digital camera, the flash memory 1230 may store image data.

In the memory card system 1000 in FIG. 15, as described above, it is possible to prevent an inadvertent increase in a threshold voltage of a flag cell by setting at least one of cells adjacent to the flag cell as a dummy cell, and/or to prevent an inadvertent decrease in a threshold voltage of a flag cell by programming at least one of dummy cells to have a predetermined level.

Figure 16:
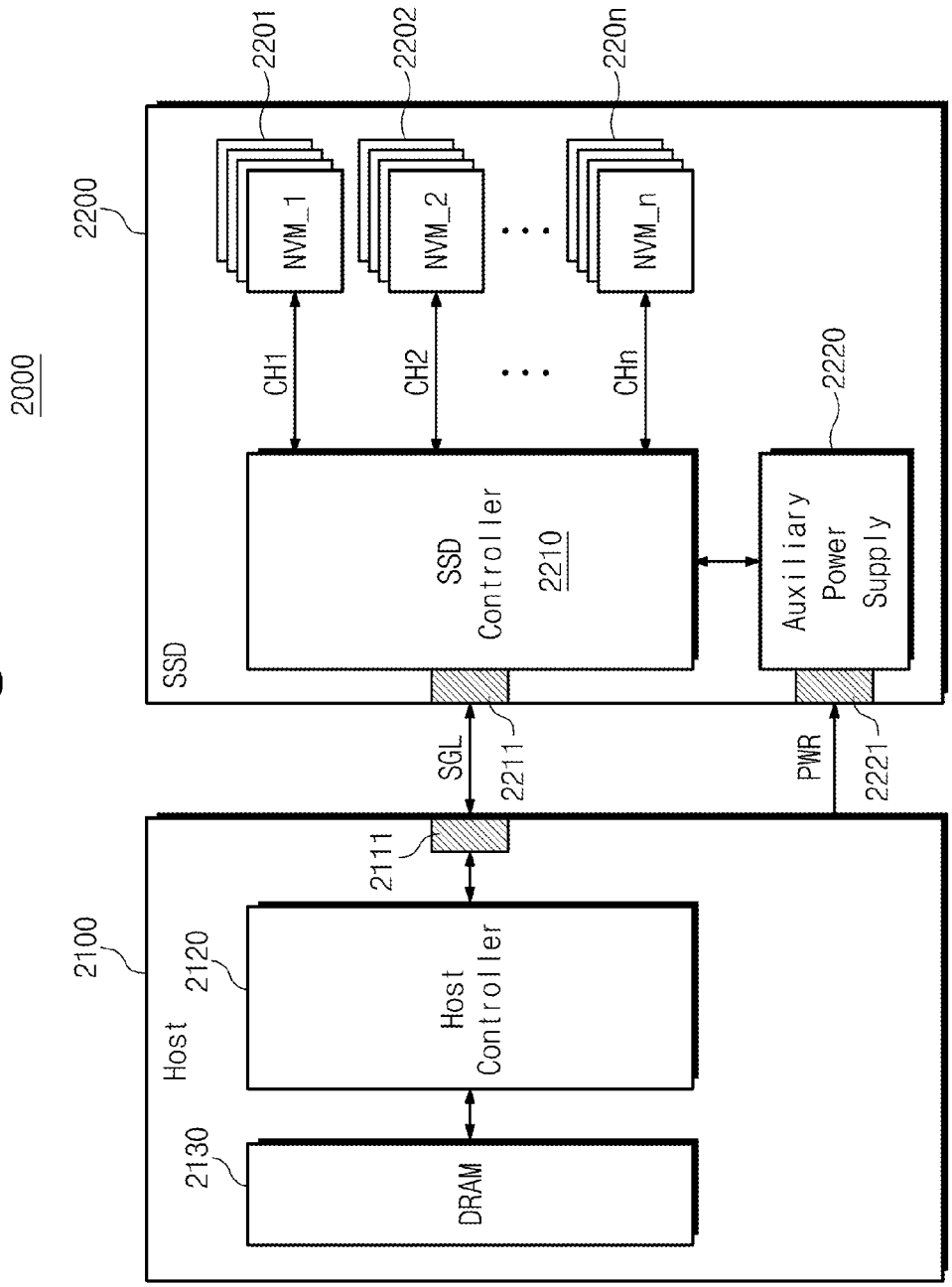
FIG. 16 is a block diagram illustrating a solid state drive system in which a memory system according to the inventive concept is applied.

FIG. 16 is a block diagram illustrating a solid state drive system in which a memory system according to the inventive concept is applied. Referring to FIG. 16, a solid state drive (SSD) system 2000 may include a host 2100 and an SSD 2200. The host 2100 may include a host interface 2111, a host controller 2120, and a DRAM 2130.

The host 2100 may write data in the SSD 2200 or read data from the SSD 2200. The host controller 2120 may transfer signals SGL such as a command, an address, a control signal, and the like to the SSD 2200 via the host interface 2111. The DRAM 2130 may be a main memory of the host 2100.

The SSD 2200 may exchange signals SGL with the host 2100 via the host interface 2211, and may be supplied with a power via a power connector 2221. The SSD 2200 may include a plurality of nonvolatile memories 2201 through 220n, an SSD controller 2210, and an auxiliary power supply 2220. Herein, the nonvolatile memories 2201 to 220n may be implemented by not only a NAND flash memory but also nonvolatile memories such as PRAM, MRAM, ReRAM, and the like.

The plurality of nonvolatile memories 2201 through 220n may be used as a storage medium of the SSD 2200. The plurality of nonvolatile memories 2201 to 220n may be connected with the SSD controller 2210 via a plurality of channels CH1 to CHn. One channel may be connected with one or more nonvolatile memories. Nonvolatile memories connected with one channel may be connected with the same data bus.

The SSD controller 2210 may exchange signals SGL with the host 2100 via the host interface 2211. Herein, the signals SGL may include a command, an address, data, and the like. The SSD controller 2210 may be configured to write or read out data to or from a corresponding nonvolatile memory according to a command of the host 2100. The SSD controller 6210 will be more fully described with reference to FIG. 16.

The auxiliary power supply 2220 may be connected with the host 2100 via the power connector 2221. The auxiliary power supply 2220 may be charged by a power PWR from the host 2100. The auxiliary power supply 2220 may be placed inside or outside the SSD 2200. For example, the auxiliary power supply 2220 may be placed on a main board to supply the auxiliary power to the SSD 2200.

Figure 17:
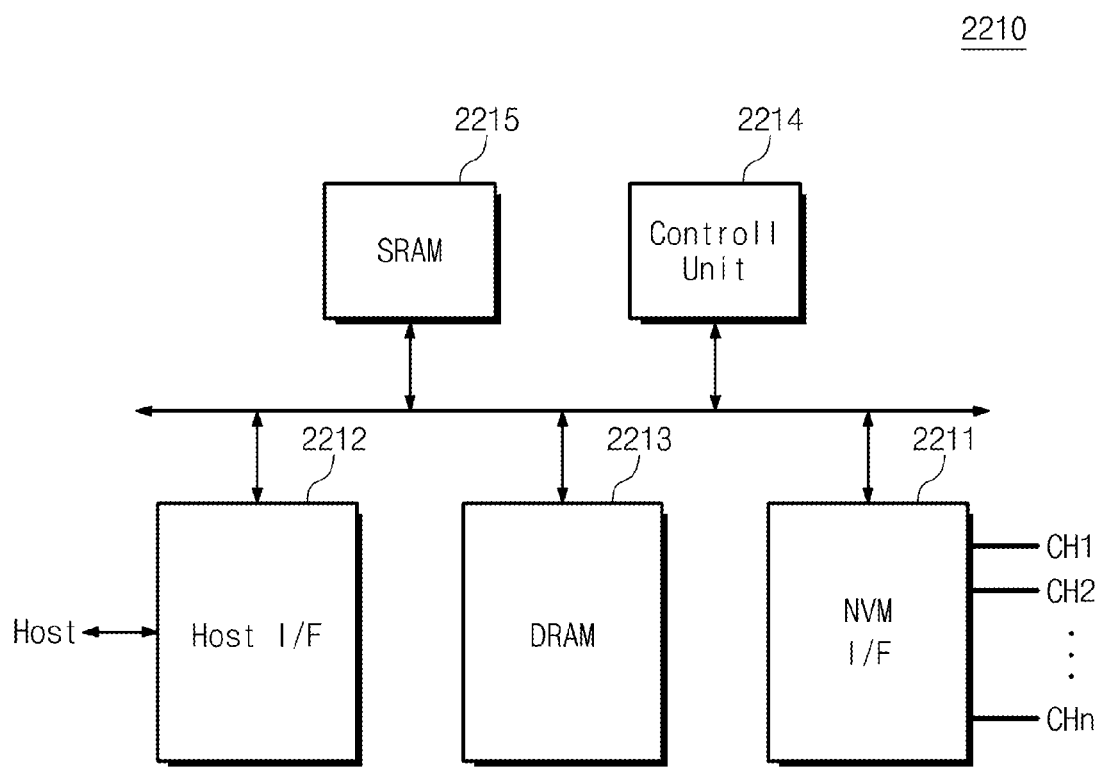
FIG. 17 is a block diagram schematically illustrating an SSD controller shown in FIG. 16.

FIG. 17 is a block diagram schematically illustrating an SSD controller in FIG. 16. Referring to FIG. 17, an SSD controller 2210 may include an NVM interface 2211, a host interface 2212, a DRAM 2213, a control unit 2214, and an SRAM 2215.

The NVM interface 2211 may scatter data transferred from a main memory of a host 2100 to channels CH1 to CHn, respectively. The NVM interface 2211 may transfer data read from nonvolatile memories 2201 to 220n to the host 2100 via the host interface 2212.

The host interface 2212 may provide an interface with an SSD 2200 according to the protocol of the host 2100. The host interface 2212 may communicate with the host 2100 using USB (Universal Serial Bus), SCSI (Small Computer System Interface), PCI express, ATA, PATA (Parallel ATA), SATA (Serial ATA), SAS (Serial Attached SCSI), and the like. The host interface 2212 may perform a disk emulation function which enables the host 2100 to recognize the SSD 2200 as a hard disk drive (HDD).

The DRAM 2213 may be used as a working memory needed to perform an overall operation of the control unit 2214. Also, the DRAM 2213 may be used as a buffer for temporarily storing data.

The SRAM 2215 may be used to drive software which efficiently manages the nonvolatile memories 2201 to 220$n$. The SRAM 2215 may store metadata input from a main memory of the host 2100 or cache data. Upon a sudden power-off operation, metadata or cache data stored in the SRAM 2215 may be stored in the nonvolatile memories 2201 to 220$n$ using an auxiliary power supply 2220.

In the SSD system 2000 in FIG. 16, as described above, it is possible to prevent an inadvertent increase in a threshold voltage of a flag cell by setting at least one of cells adjacent to the flag cell as a dummy cell, and/or to prevent an inadvertent decrease in a threshold voltage of a flag cell by programming at least one of dummy cells to have a predetermined level.

Figure 18:
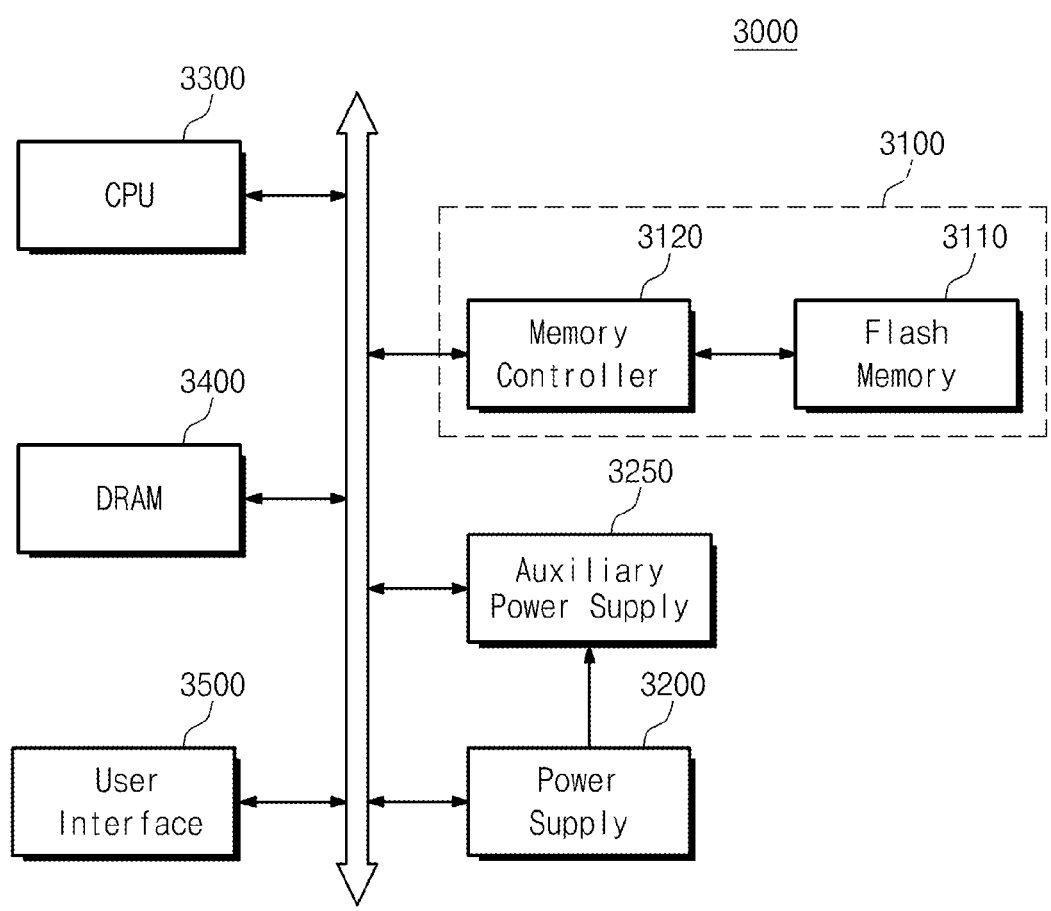
FIG. 18 is a block diagram schematically illustrating an electronic device including a flash memory system according to an embodiment of the inventive concept.

FIG. 18 is a block diagram schematically illustrating an electronic device including a flash memory system according to an embodiment of the inventive concept. Herein, an electronic device 3000 may be a personal computer or a handheld electronic device such as a notebook computer, a cellular phone, a PDA, a camera, and the like.

Referring to FIG. 18, the electronic device 3000 may include a memory system 3100, a power supply device 3200, an auxiliary power supply 3250, a CPU 3300, a DRAM 3400, and a user interface 3500. The memory system 3100 may include a flash memory 3110 and a memory controller 3120. The memory system 3100 can be embedded within the electronic device 3000.

In the electronic device 3000, as described above, it is possible to prevent an inadvertent increase in a threshold voltage of a flag cell by setting at least one of cells adjacent to the flag cell as a dummy cell, and/or to prevent an inadvertent decrease in a threshold voltage of a flag cell by programming at least one of dummy cells to have a predetermined level.

A memory system according to an embodiment of the inventive concept is applicable to a flash memory having a three-dimensional structure as well as a flash memory having a two-dimensional structure.

Figure 19:
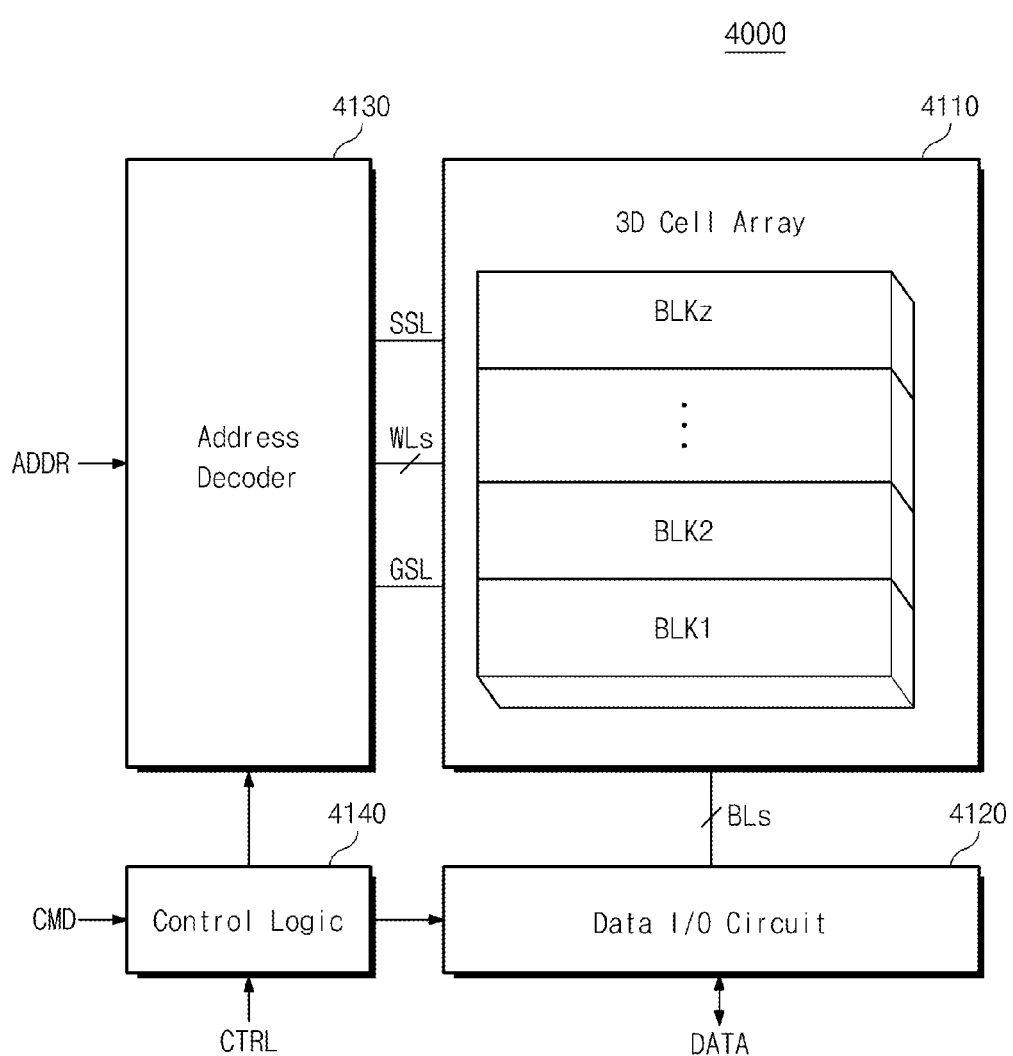
FIG. 19 is a block diagram schematically illustrating a flash memory applied to the inventive concept.

FIG. 19 is a block diagram schematically illustrating a flash memory applied to the inventive concept. Referring to FIG. 19, a flash memory 4000 may include a three-dimensional (3D) cell array 4110, a data input/output circuit 4120, an address decoder 4130, and control logic 4140.

The 3D cell array 4110 may include a plurality of memory blocks BLK1 to BLKz, each of which is formed to have a three-dimensional structure (or, a vertical structure). For a memory block having a two-dimensional (horizontal) structure, memory cells may be arranged in a direction horizontal to a substrate. For a memory block having a three-dimensional structure, memory cells may be arranged in a direction perpendicular to the substrate. Each memory block may be an erase unit of the flash memory 4000.

The data input/output circuit 4120 may be connected with the 3D cell array 4110 via a plurality of bit lines. The data input/output circuit 4120 may receive data from an external device or output data read from the 3D cell array 4110 to the external device. The address decoder 4130 may be connected with the 3D cell array 4110 via a plurality of word lines and selection lines GSL and SSL. The address decoder 4130 may select the word lines in response to an address ADDR.

The control logic 4140 may control programming, erasing, reading, and so on of the flash memory 4000. For example, during programming, the control logic 4140 may control the address decoder 4130 such that a program voltage is supplied to a selected word line, and may control the data input/output circuit 4120 such that data is programmed.

Figure 20:
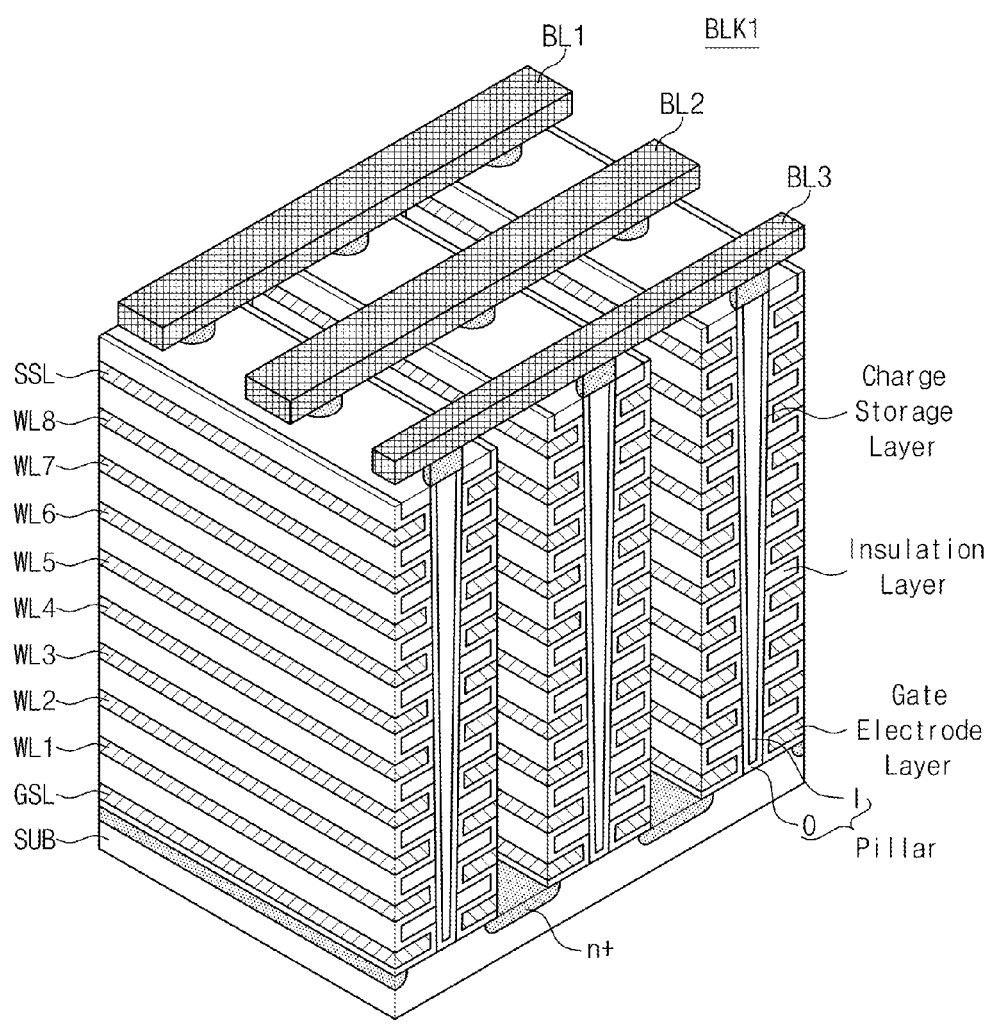
FIG. 20 is a perspective view schematically illustrating a 3D structure of a memory block illustrated in FIG. 19.

FIG. 20 is a perspective view schematically illustrating an example of a 3D structure of a memory block illustrated in FIG. 19. Referring to FIG. 20, a memory block BLK1 may be formed in a direction perpendicular to a substrate SUB. An n+ doping region may be formed at the substrate SUB. A gate electrode layer and an insulation layer may be deposited on the substrate SUB in turn. A charge storage layer may be formed between the gate electrode layer and the insulation layer.

If the gate electrode layer and the insulation layer are patterned in a vertical direction, a V-shaped pillar may be formed. The pillar may be connected with the substrate SUB via the gate electrode layer and the insulation layer. An outer portion O of the pillar may be formed of a channel semiconductor, and an inner portion I thereof may be formed of an insulation material such as silicon oxide.

The gate electrode layer of the memory block BLK1 may be connected with a ground selection line GSL, a plurality of word lines WL1 to WL8, and a string selection line SSL. The pillar of the memory block BLK1 may be connected with a plurality of bit lines BL1 to BL3. In FIG. 20, there is illustrated as an example the case where one memory block BLK1 has two selection lines SSL and GSL, eight word lines WL1 to WL8, and three bit lines BL1 to BL3. However, the inventive concept is not limited thereto.

Figure 21:
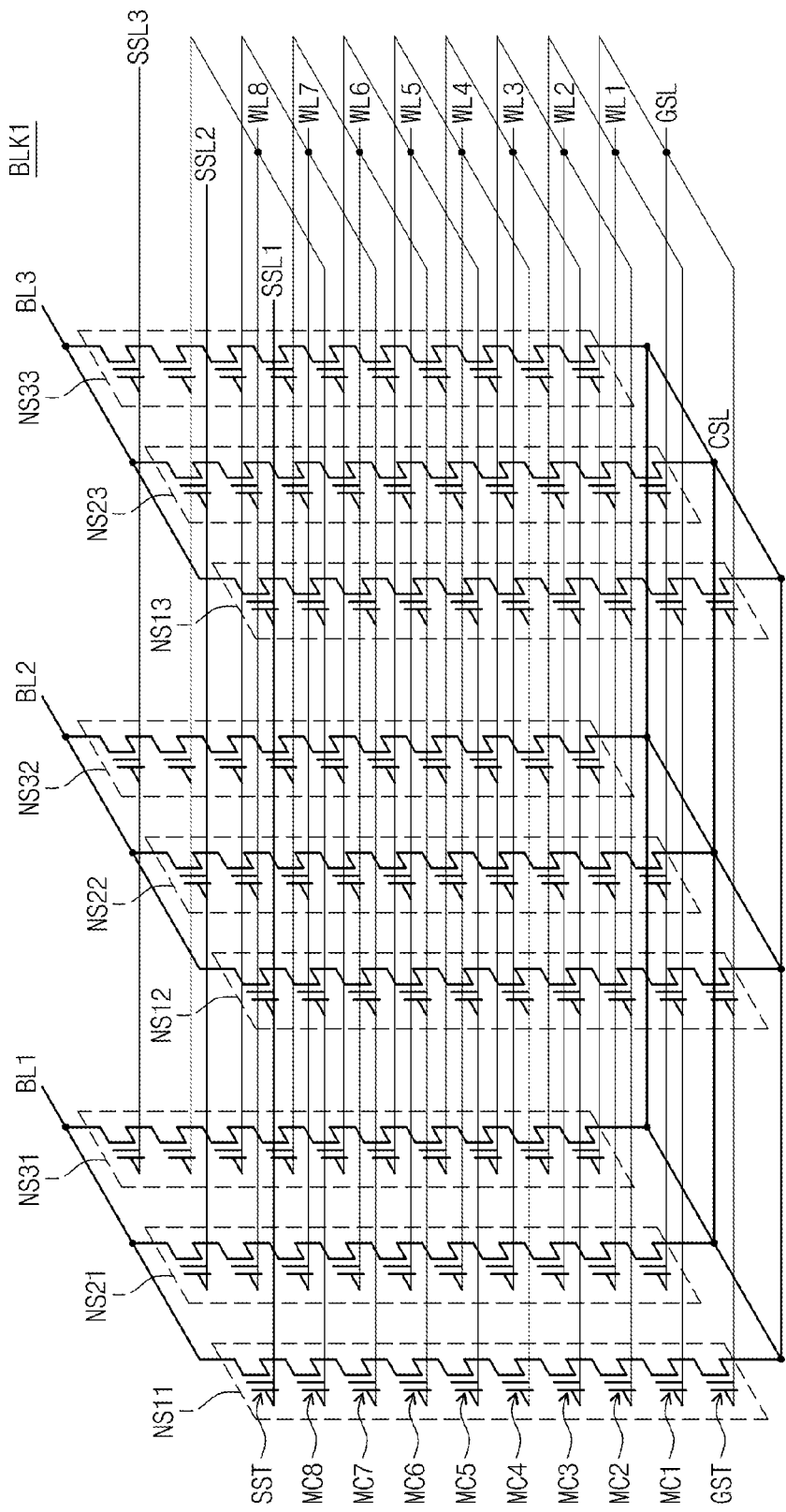
FIG. 21 is a circuit diagram schematically illustrating an equivalent circuit of a memory block illustrated in FIG. 20.

FIG. 21 is a circuit diagram schematically illustrating an equivalent circuit of a memory block illustrated in FIG. 20. Referring to FIG. 21, NAND strings NS11 to NS33 may be connected between bit lines BL1 to BL3 and a common source line CSL. Each NAND string (e.g., NS11) may include a string selection transistor SST, a plurality of memory cells MC1 to MC8, and a ground selection transistor GST.

The string selection transistors SST may be connected with string selection lines SSL1 to SSL3. The memory cells MC1 to MC8 may be connected with corresponding word lines WL1 to WL8, respectively. The ground selection transistors GST may be connected with ground selection line GSL. A string selection transistor SST may be connected with a bit line, and a ground selection transistor GST may be connected with a common source line CSL.

Word lines (e.g., WL1) and the ground selection line GSL having the same height may be connected in common, and the string selection lines SSL1 to SSL3 may be separated from one another. During programming of memory cells (constituting a page) connected with a first word line WL1 and included in NAND strings NS11, NS12, and NS13, there may be selected a first word line WL1 and a first string selection line SSL1.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory device, comprising:
a flag cell configured to store flag information;
a plurality of dummy cells adjacent to the flag cell; and
program control logic configured to control a program operation of the flag cell and a dummy program operation of the plurality of dummy cells, wherein, when the program operation of the flag cell is performed, the program control logic performs the dummy program operation of at least one of the plurality of dummy cells.

2. The nonvolatile memory device of claim 1, wherein, in the dummy program operation, the program control logic omits a verification read operation.

3. The nonvolatile memory device of claim 1, wherein the program control logic performs the program operation on the flag cell and the dummy program operation using an incremental step pulse program (ISPP), and wherein a number of ISPP program loops of the dummy program operation is less than a number of ISPP program loops of the program operation on the flag cell.

4. The nonvolatile memory device of claim 3, wherein a level of a dummy program voltage at a time when the dummy program operation is started is lower than a level of a program voltage at a time when the program operation on the flag cell is started.

5. The nonvolatile memory device of claim 1, further comprising:
a word line connected in common to at least one of the dummy cells and the flag cell;
a dummy bit line connected with a dummy programmed dummy cell among the plurality of dummy cells; and
a flag bit line connected with the flag cell,
wherein the program control logic provides stepwise increasing program voltages to the dummy programmed dummy cell and the flag cell via the word line according to an incremental step pulse program (ISPP) including a plurality of ISPP program loops, and provides a program-inhibition voltage to the dummy bit line during a ISPP program loop where a ground voltage is provided to the flag bit line.

6. The nonvolatile memory device of claim 1, wherein the dummy programmed dummy cell and the flag cell are connected via the same word line, and the dummy program operation and the program operation on the flag cell are performed at the same time.

7. The nonvolatile memory device of claim 1, wherein a threshold voltage of the dummy programmed dummy cell is higher than a threshold voltage of an erase state and lower than a threshold voltage of a programmed flag cell.

8. A user device, comprising:
a nonvolatile memory device; and
a controller configured to control the nonvolatile memory device,
wherein the nonvolatile memory device comprises:
flag cells configured to store flag information of corresponding pages, respectively; and
a plurality of dummy cells adjacent to the plurality of flag cells,
wherein when a selected one of the flag cells is programmed, a dummy program operation is performed on at least one of the plurality of dummy cells adjacent to the selected flag cell.

9. The user device of claim 8, wherein the nonvolatile memory device further comprises:
first and second flag bit lines connected to first and second flag cells of the plurality of flag cells, respectively; and
first and second dummy bit lines connected to first and second dummy cells of the plurality of dummy cells, respectively, the first and second flag bit lines and the first and second dummy bit lines being disposed in turn.

10. The user device of claim 9, wherein the nonvolatile memory device further comprises:

a first word line connected in common to the first flag cell and the first dummy cell; and
a second word line connected in common to the second flag cell and the second dummy cell,
wherein a plurality of program loops are executed in which stepwise increasing program voltages are provided to the first flag cell and the first dummy cell via the first word line, and a program-inhibition voltage is provided to the first dummy cell via the first dummy bit line during at least one program loop of the plurality of program loops.

11. The user device of claim 10, wherein when a program-inhibition voltage is provided to the first dummy cell via the first dummy bit line, a power supply voltage is provided to the first flag cell via the first flag bit line.

12. The user device of claim 10, wherein a plurality of program loops are executed in which stepwise increasing program voltages are provided to the second flag cell and the second dummy cell via the second word line, and a power supply voltage is provided to the second flag cell and the second dummy cell via the second flag bit line and the second dummy bit line during the plurality of program loops.

13. The user device of claim 9, wherein flag cells, corresponding to the first flag bit line, from among the plurality of flag cells and dummy cells, corresponding to the first flag bit line, from among the plurality of dummy cells form a flag cell string, and flag and dummy cells belonging to the flag cell string are disposed in turn.

14. The user device of claim 8, wherein a level of a program voltage provided to the selected flag cell at a time when programming of the selected flag cell is started is lower than a level of a dummy program voltage provided to the at least one dummy cell at a time when the dummy program operation is started.

15. The user device of claim 8, wherein the dummy program operation is devoid of a verification read operation.

16. A user device comprising a nonvolatile memory device including a plurality of memory blocks, and a controller configured to control the nonvolatile memory device, wherein each memory block of the nonvolatile memory device comprises:
a plurality of main bit lines, first and second flag bit lines, and first and second dummy bit lines;
a plurality of word lines intersecting the main bit lines, the first and second flag bit lines, and the first and second dummy bit lines;
a plurality of main memory cells respectfully connected at intersections between the main bit lines and the word lines;
a plurality of flag cells respectively connected at intersections between the word lines and either the first or second flag bit line; and
a plurality of dummy cells respectively connected at intersection between the word lines and dummy bit lines, and at intersections between the word lines and either of the first or second flag bit lines;
wherein at least one of the dummy cells is interposed between each flag cell and each main memory cell, and between each flag cell and each other flag cell, and
wherein the controller is configured execute a flag cell programming operation in which a threshold voltage of a flag cell is increased, and is further configured to execute a dummy cell program operation, in response to execution of the flag cell programming operation, in which a threshold voltage of at least one dummy cell adjacent the flag cell is increased.

17. The user device of claim 16, wherein each flag cell is programmed to indicate whether each corresponding word line is LSB programmed or MSB programmed.

18. The user device of claim 16, wherein the flag cell programming operation and the dummy cell programming operation are executed according to an incremental step pulse program (ISPP).

19. The user device of claim 18, wherein the ISPP of the dummy cell programming operation is devoid of a read verification operation.

20. The user device of claim 16, wherein the nonvolatile memory is a NAND flash memory.

* * * * *